United States Patent
Ota et al.

(10) Patent No.: US 6,535,272 B2
(45) Date of Patent: Mar. 18, 2003

(54) POSITION TRANSDUCER AND EXPOSURE APPARATUS WITH SAME

(75) Inventors: Kazuya Ota, Tokyo (JP); Jiro Inoue, Kanagawa-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/901,885

(22) Filed: Jul. 9, 2001

(65) Prior Publication Data

US 2001/0046037 A1 Nov. 29, 2001

Related U.S. Application Data

(60) Continuation of application No. 09/512,793, filed on Feb. 25, 2000, which is a continuation of application No. 09/234,452, filed on Jan. 21, 1999, now abandoned, which is a division of application No. 08/847,480, filed on Apr. 25, 1997, now abandoned.

(30) Foreign Application Priority Data

Apr. 26, 1996 (JP) .............................. 8-106650
Apr. 26, 1996 (JP) .............................. 8-106651

(51) Int. Cl.[7] ..................... G03B 27/42; G03B 27/54; G01B 11/00; G01B 9/02
(52) U.S. Cl. ..................... 355/53; 355/67; 356/400; 356/490
(58) Field of Search ..................... 356/399, 400, 356/401, 349, 490; 355/53, 55, 67; 250/227.12, 559.24, 554.3

(56) References Cited

U.S. PATENT DOCUMENTS

| 5,329,354 A | 7/1994 | Yamamoto et al. ......... 256/349 |
| 5,488,230 A | 1/1996 | Mizutani et al. ............ 356/400 |
| 5,530,778 A | 6/1996 | Rast ...................... 250/227.12 |
| 5,602,644 A | 2/1997 | Ota ............................ 356/363 |
| 5,689,339 A | 11/1997 | Ota et al. .................... 356/401 |
| 5,801,390 A | 9/1998 | Shiraishi .................. 250/559.3 |
| 5,859,707 A | 1/1999 | Nakagawa et al. ......... 356/401 |
| 6,034,378 A | 3/2000 | Shiraishi ................ 250/559.29 |

FOREIGN PATENT DOCUMENTS

JP 1-212436 8/1989

Primary Examiner—Russell Adams
Assistant Examiner—Peter B. Kim
(74) Attorney, Agent, or Firm—Armstrong, Westerman & Hattori, LLP

(57) ABSTRACT

The exposure apparatus is provided in its main body portion with laser diodes each having different wave-lengths, for illuminating light for alignment onto a mark of a grating form arranged on each of a reticle and a wafer. The main body portion of the exposure apparatus has photomultipliers for receiving the diffraction light returned from each of the reticle mark and the wafer mark. The alignment of the reticle mark with the wafer mark is implemented by comparing phase differences of optical beat signals converted photo-electrically by the photomultipliers and by means of a phase detection comparison system. The light fluxes are transmitted between photomultipliers the laser diodes and the alignment optical system disposed in the main body portion thereof through optical fibers. This arrangement enables the position transducer to reduce an influence of generated heat upon the position detection of the wafer as well as the exposure apparatus, even if a photodetector having a large calorific power is employed.

24 Claims, 10 Drawing Sheets

POSITION TRANSDUCER AND EXPOSURE APPARATUS WITH SAME

This application is a continuation of prior application Ser. No. 09/512,793 filed Feb. 25, 2000, which is a continuation of prior application Ser. No. 09/234,452 filed Jan. 21, 1999, now abandoned, which is a divisional of prior application Ser. No. 08/847,480 filed Apr. 25, 1997 now abandoned.

BACKGROUND OF THE INVENTION

1. Field of the Invention

The present invention relates to a position transducer and an exposure apparatus with the same and, more particularly, to a position transducer and an exposure apparatus with the same, a position transducer being suitable for use with an alignment sensor for an exposure apparatus for exposing a pattern on a mask to a photosensitizable substrate in a photolithographic step for manufacturing semiconductor elements, liquid crystal display elements, image pick-up tubes (CCDs etc.), thin layer magnetic heads and so on.

2. Description of the Related Art

In a photolithographic step for manufacturing semiconductor elements and so on, there has hitherto been frequently employed a so-called stepper for exposing and transcribing a pattern of a reticle as a mask on each shot area on a photosensitizable substrate, such as a wafer, a glass plate or the like, by a step-and-repeat exposure system as an exposure apparatus to be employed for exposing and transcribing a pattern of a reticle acting as a mask onto such a photosensitizable substrate with a photoresist layer coated thereon.

Recently, there is being employed an exposure apparatus of a scanning exposure type, for example, of a step-and-scan system comprising exposing a reticle to a wafer while scanning the reticle and the wafer in synchronization with a projection optical system. Such exposure apparatuses require a particularly high level of precision in alignment of the reticle with each shot area on the wafer due to the fact that multiple layers of circuit patterns are superimposed on the wafer in manufacturing semiconductor elements and so on. Therefore, alignment sensors of various types and systems are employed for such exposure apparatuses.

Among conventional alignment sensors, an alignment sensor of a so-called grating alignment method uses laser beams as a source of alignment and a wafer mark in the form of a grating with its bars or dots arranged periodically. This grating alignment method may be classified by the structure of an alignment optical system or a detection system, a number of alignment beams of light and so on. The grating alignment method may further be broken down into the following types.

A first type of the grating alignment method is of the type comprising allowing one laser beam to strike the whole area of a wafer mark on a wafer, causing two rays of diffraction light generated from the wafer mark to form an image on a reference grating, scanning the wafer mark relative to the reference grating, and detecting the position of the wafer mark on the basis of a variation with a quantity of light transmitted through the reference grating or reflected therefrom.

A second type of the grating alignment method is of the type comprising allowing two laser beams to strike the whole area of a wafer mark on a wafer from the particular yet mutually different directions of the diffraction order and detecting the position of the wafer mark on the basis of the phase of interference light generating in the identical direction from the wafer mark. This is called as an LIA (Laser Interferometric Alignment) type.

The LIA type may be classified into two groups, one group being of a homodyne interference type transferring a wafer mark relative to a static interference fringe formed by two laser beams having no frequency difference and the other being of a heterodyne interference type measuring a phase difference between a signal photoelectrically detecting an interference light (beat light) of two diffraction light components generated from the wafer mark by two laser beams having a slight difference of frequencies therebetween and a reference signal having the same frequency as the frequency difference between the two laser beams and detecting the phase difference as an amount of a pitch-directional deviation of the position of the wafer mark of the grating form from the predetermined reference point.

Where the diffraction light generated from the grating-shaped wafer mark is detected as a signal using a source of monochromatic light in the manner as described hereinabove, the shape of the grating wafer mark may become non-symmetric as multiple thin layers are superimposed on a wafer substrate more and more, or no diffraction light to be detected may be generated for laser beams of certain wavelengths striking the wafer mark due to interference of a thin layer of the surface photoresist coating or for other reasons, or errors in detecting the diffraction light may be caused to occur due to a very faint intensity of the diffraction light generated therefrom. In order to solve those problems and to enable a more accurate detection of the position of the wafer mark, there has been developed an alignment sensor of a heterodyne interference type using a source of polychromatic light having multiple wavelengths.

An alignment sensor of a heterodyne interference type using a light flux with multiple wavelengths is constructed so as to allow two laser beams having different wavelengths to strike the wafer mark of a wafer from a direction of a particular order after the two laser beams with different wavelengths are modified to provide a slight difference in frequency therebetween and to photoelectrically detect the interference light consisting of the multiple wavelength components generated therefrom. The diffraction light of each wavelength component is photoelectrically detected in the form in which it is summed up altogether on a light recipient surface of a photoelectrical detection element, as an example, so that the detection of the position of the wafer mark may be less affected by an influence of interference of the thin layer on the photoresist coating or a deviation of the diffraction light due to an influence of non-symmetric shape between the sectional shapes of the wafer mark.

Further, there is another method of detecting diffraction light using an alignment sensor of a system referred to as an LSA (Laser Step Alignment) system, like the grating alignment system, which comprises forming a laser spot on the wafer by converging one laser beam thereonto, scanning the laser spot relative to the wafer with a wafer mark with dots arranged linearly thereon through a wafer stage, and detecting the position of the wafer mark on the basis of the intensity of diffraction light generated upon passage through the wafer mark beneath the laser spot.

For such conventional alignment sensors, a photomultiplier is employed as a photodetector when a sensitivity of light for detection from the wafer mark is required to be enhanced. Such a photomultiplier, however, may become a cause to induce a variation in temperature or a temperature gradient in the atmosphere surrounding it because it generates heat upon operation in progress. On the other hand, hitherto, the alignment sensor has been provided in the vicinity of an exposing main body portion of an exposure apparatus with the object of making the exposure apparatus compact. There is a risk, accordingly, that the exposing main body portion thereof and the wafer as a recipient that is exposed to light undergo thermal expansion or other transformation, causing faults and irregularities in accuracy of alignment and of exposure to light (accuracy of superimposition). In addition, as a photomultiplier is usually large in size, it is difficult in terms of making the exposure apparatus compact in size as a whole to locate such a photomultiplier nearby the exposing main body portion thereof.

Furthermore, even when there are some cases where a photodiode or the like is employed as a photodetector, a preamplifier and other means provided on such a photodetector may also become a source of generating heat. Where the photodetector generates heat, the heat may cause turbulence of the air surrounding it, resulting in disturbance of the light to be employed for the detection of alignment. This of course may adversely affect the accuracy in the detection of the wafer mark on the wafer.

Particularly, when a source of light having multiple wavelengths is employed for alignment, there are cases in some uses, where such light of different wavelengths is required to be received for detection by different photodetectors. In this case, the number of the photodetectors increases so that the amount of heat generated by them becomes larger leading to the larger possibility of inducing faults and irregularities in precision of exposure. In addition, the source of light for alignment may adversely affect precision in exposure as a source of generating heat, like photodetectors.

SUMMARY OF THE INVENTION

Therefore, the present invention has a primary object of providing a position transducer that does not substantially exert an influence of heat upon a substrate to be subjected to detection.

The present invention has another object of providing a position transducer constructed so as to separate a heat source from the exposure apparatus in order to fail to cause the heat generated from the heat source to exert an adverse influence upon a substrate to be subjected to detection.

The present invention has a further object of providing a position transducer that does not or little undergo an adverse influence upon such a substrate due to turbulence of air within the exposure apparatus or for other reasons.

The present invention has a still further object of providing a position transducer that can reduce or minimize an adverse influence to be otherwise exerted upon such a substrate by the generation of heat from a photodetector when such a photodetector having a large calorific power is employed.

The present invention has another still further object of providing a position transducer that can reduce an adverse influence upon such a substrate and enables the detection of a position of the substrate with a high degree of precision, even if a light flux of multiple wavelengths is employed as a light flux for position detection.

The present invention has another still further object of providing an exposure apparatus with such a position transducer disposed therewith, particularly to provide an exposure apparatus capable of excluding an influence from the heat generated from the light for alignment even when there is employed a light source for alignment of a large calorific power, like a light source having multiple wavelengths.

In addition, the present invention has still another object of providing an exposure apparatus with such a position transducer, which does not cause any decrease in precision of alignment even if an optical fiber or the like is employed upon alignment using a light flux of multiple wavelengths.

In order to achieve the objects as described hereinabove, the position transducer according to the present invention is constructed from an illumination optical system for illuminating a light flux for position detection onto a mark for position detection formed on a substrate to be detected, and from a photodetector for receiving the light flux returned from the mark for position detection so as to detect the position of the substrate on the basis of a signal converted photoelectrically by the photodetector, wherein an optical guide is provided for leading the light flux returned from the mark for position detection to the photodetector.

With the arrangement of the position transducer according to the present invention, the substrate to be detected and the exposing main body portion of the exposure apparatus can be separated and isolated from the photodetector acting as the heat source by transmitting the light flux returning from the mark for position detection via the optical guide, thereby excluding such actors as exert an adverse influence upon the detection of the position with high precision, such as thermal expansion or the like.

Further, the arrangement of the position transducer according to the present invention can serve to improve the precision of position detection because the light flux is transmitted to the photodetector via the optical guide and there can be employed a light flux that does not undergo any influence by turbulence of the air surrounding the photodetector.

In this case, it can be taken as an example that, preferably, the light flux for position detection comprises a light flux of multiple wavelengths and the light flux to be returned from the mark for position detection to the photodetector is led for each wavelength through a different optical guide to the photodetector. With this arrangement, an influence of the heat generated from the photodetector can be alleviated or decreased as compared with the instance where light fluxes each of multiple wavelengths are received by the respective photodetectors.

Further, it is preferred that there is employed, as the optical guide, an optical fiber being so adapted as to have its propagation efficiency optimized to the wavelength of the light flux as an object of propagation. The use of such an optical fiber enables the transmission of the light flux of multiple wavelengths at their respectively minimized attenuation ratios, thereby providing, for example, a signal for position detection for each wavelength accurately at an equal SN ratio.

It is additionally preferred that, when the mark for position detection comprises a mark of a diffraction grating form with dots, bars etc. arranged each by a predetermined pitch in the direction of measurement, for example, as shown in FIG. 7, the illumination optical system is constructed by an optical system for illuminating mutually coherent multiple light fluxes as the light flux for position detection from different directions onto the mark of the diffraction grating form, and the photodetector comprises a first photodetector and a second photodetector with each optical guide disposed so as to lead first and second diffraction light separately or independently from each other to the first and second photodetectors, respectively, the first photodetector being arranged so as to receive the first diffraction light consisting of multiple rays of diffraction light generating in a direction parallel to a first direction from the mark of the diffraction grating form, and the second photodetector arranged so as to receive the second diffraction light consisting of multiple rays of diffraction light generating in a direction parallel to a second direction yet different from the first direction from the mark of the diffraction grating form. This construction allows two different kinds of interference light generating in the different directions to be detected independently and separately from each other.

It is furthermore preferred that, when the light flux for position detection comprises a light flux of multiple wavelengths, the light flux of the multiple wavelengths is led for each wavelength to the corresponding illumination optical system through each of the plural optical guides. The manner of transmission of the light flux of each wavelength via each of the mutual optical guides can reduce such an influence to be otherwise exerted by the generation of heat from the light flux for position detection.

Further, the exposure apparatus according to the present invention comprises an exposing main body portion for transcribing a mask pattern on a photosensitizable substrate and a position detection system for detecting a mark of position alignment formed on the photosensitizable substrate, which are constructed in such a manner that the mask pattern is aligned with the photosensitizable substrate on the basis of a result of detection by the position detection system. In the arrangement of the exposure apparatus as described hereinabove, the position detection system comprises a laser light source for generating laser light of multiple wavelengths, an illumination optical system for illuminating the laser light from the laser light source onto the mark for position detection on the photosensitizable substrate, and a light recipient optical system for receiving the light returned from the mark for position detection, the laser light source being disposed separated or isolated from the exposing main body portion of the exposure apparatus. The manner of separating or isolating the laser light source from the exposing main body portion thereof may include, for example, accommodating either of them in a discrete chamber or accommodating both of them with a portion thereof air-conditioned forcibly.

By separating or isolating the laser light source generating laser light of multiple wavelengths, which acts as a heat source in the position detection system, from the exposing main body portion, adverse influences upon the exposing main body portion and the photosensitizable substrate, which may be otherwise exerted by the heat generated from the laser light source, can be excluded. Further, by implementing alignment using laser light of multiple wavelengths, alignment of a high degree of precision can be achieved without any great interference among thin layers of a photosensitizable substrate or a shape of the mark for position detection.

In this case, the exposure apparatus is preferably arranged such that laser light of multiple wavelengths from the laser light source is led to the illumination optical system through a different optical guide for each wavelength. Further, at this time, it is possible to use an optical guide, such as an optical fiber, with its transmission efficiency optimized for each of the wavelengths, so that laser light of multiple wavelengths can be utilized effectively. Further, by synthesizing laser light of multiple wavelengths in the vicinity of the exposing main body portion of the exposure apparatus, the position of the mark for position detection can be detected with high precision.

In accordance with the position transducer and the exposure apparatus according to the present invention, the light recipient optical system is so arranged as to receive, for example, diffraction light generated by the laser light from the mark for position detection in the predetermined direction. This means that the present invention is applied to an exposure apparatus utilizing the alignment system of the grating alignment method or of the LSA method.

In this case, further, the illumination optical system may be so arranged as to illuminate the laser light of multiple wavelengths onto a comfrising mark dots arranged linearly for position detection, and the position of the mark linear dot is to be detected on the basis of an amount of diffraction light received by the light recipient optical system. This means that there is employed an alignment system of the LSA method in which the light flux is of multiple wavelengths.

Other objects, features and advantages of the subject invention will become apparent in the course of the following description with reference to the accompanying drawings.

DESCRIPTION OF THE PREFERRED EMBODIMENTS

First Embodiment

The exposure apparatus in the first embodiment according to the present invention will be described with reference to FIGS. 1 to 6. This embodiment of the exposure apparatus is of the type in which the present invention is applied to a projection exposure apparatus of a stepper type with an alignment sensor of the LIA system. The alignment sensor to be employed in this embodiment is arranged so as to adapt to multiple wavelengths.

Figure 1:
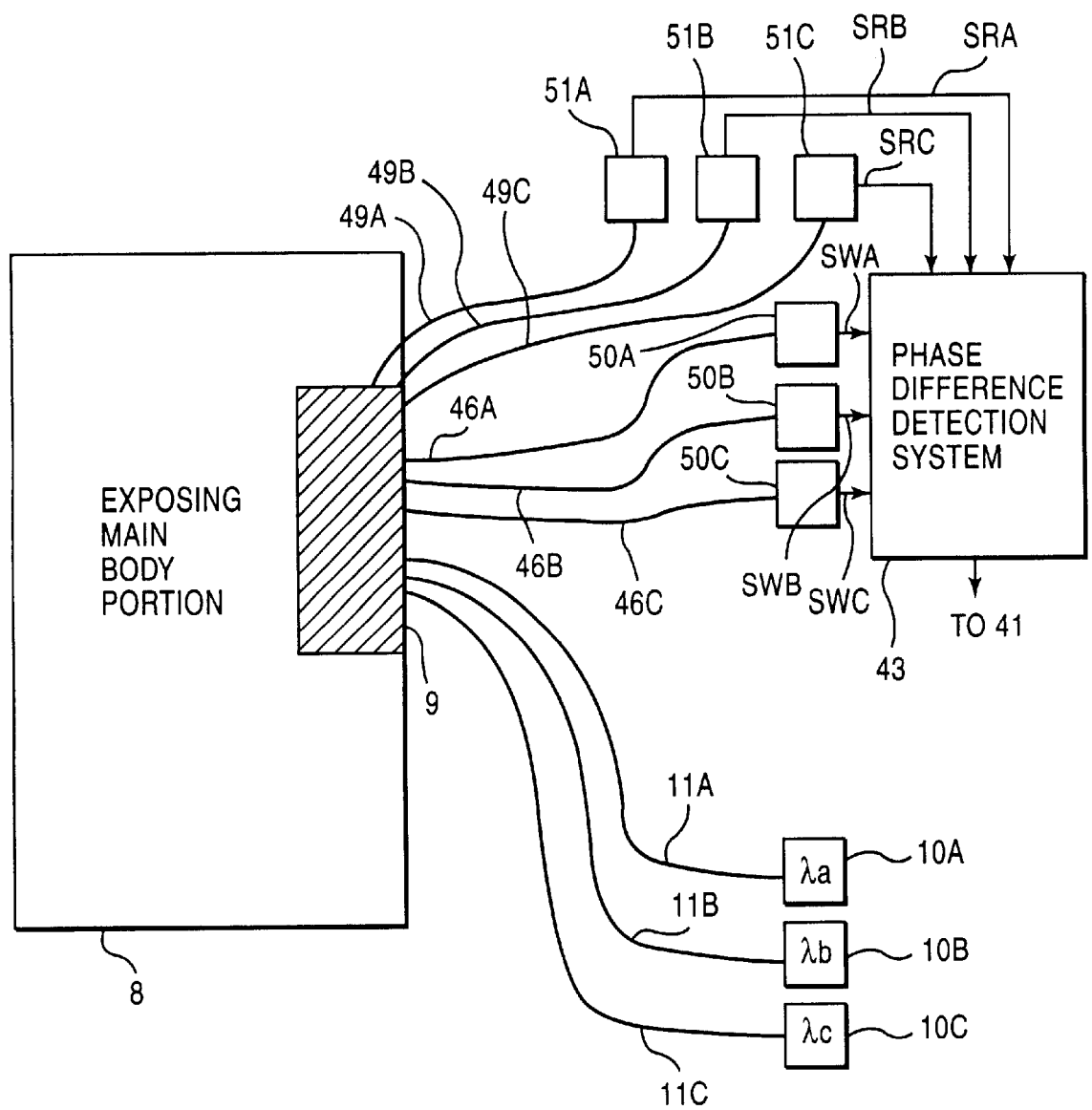
FIG. 1 is a block diagram showing an exposure apparatus with a position transducer according to a first embodiment of the present invention.

FIG. 1 is a block diagram showing the projection exposure apparatus according to the first embodiment of the present invention. In FIG. 1, as a light source for use in alignment, there are employed three different light sources 10A, 10B and 10C, each consisting of a laser diode capable of generating laser beams having wavelengths $\lambda A$, $\lambda B$ and $\lambda C$, respectively. More specifically, the first light source 10A generates laser beams having the wavelength $\lambda A$ (hereinafter referred to from time to time as "light flux LA"), the second light source generates laser beams having the wavelength $\lambda B$ (hereinafter referred to from time to time as "light flux LB"), and the first light source 10C generates laser beams having the wavelength $\lambda C$ (hereinafter referred to from time to time as "light flux LC"). As an example, the wavelengths $\lambda A$, $\lambda B$ and $\lambda C$ may be set as 635 nm, as 690 nm and as 780 nm, respectively. Further, the light fluxes LA–LC, inclusive, may be polarized linearly.

In the first embodiment, there may be employed optical fibers 11A, 11B and 11C, each having the characteristic for holding a plane of polarization with its propagation efficiency optimized to each of the wavelengths $\lambda A$, $\lambda B$ and $\lambda C$, respectively. The light fluxes LA, LB and LC generated as light for alignment from the first, second and third light sources 10A, 10B and 10C are transmitted to an alignment optical system 9, respectively, via the optical fibers 11A, 11B and 11C with each of the propagation efficiency optimized to each of the respective wavelengths $\lambda A$, $\lambda B$ and $\lambda C$.

Figure 2:
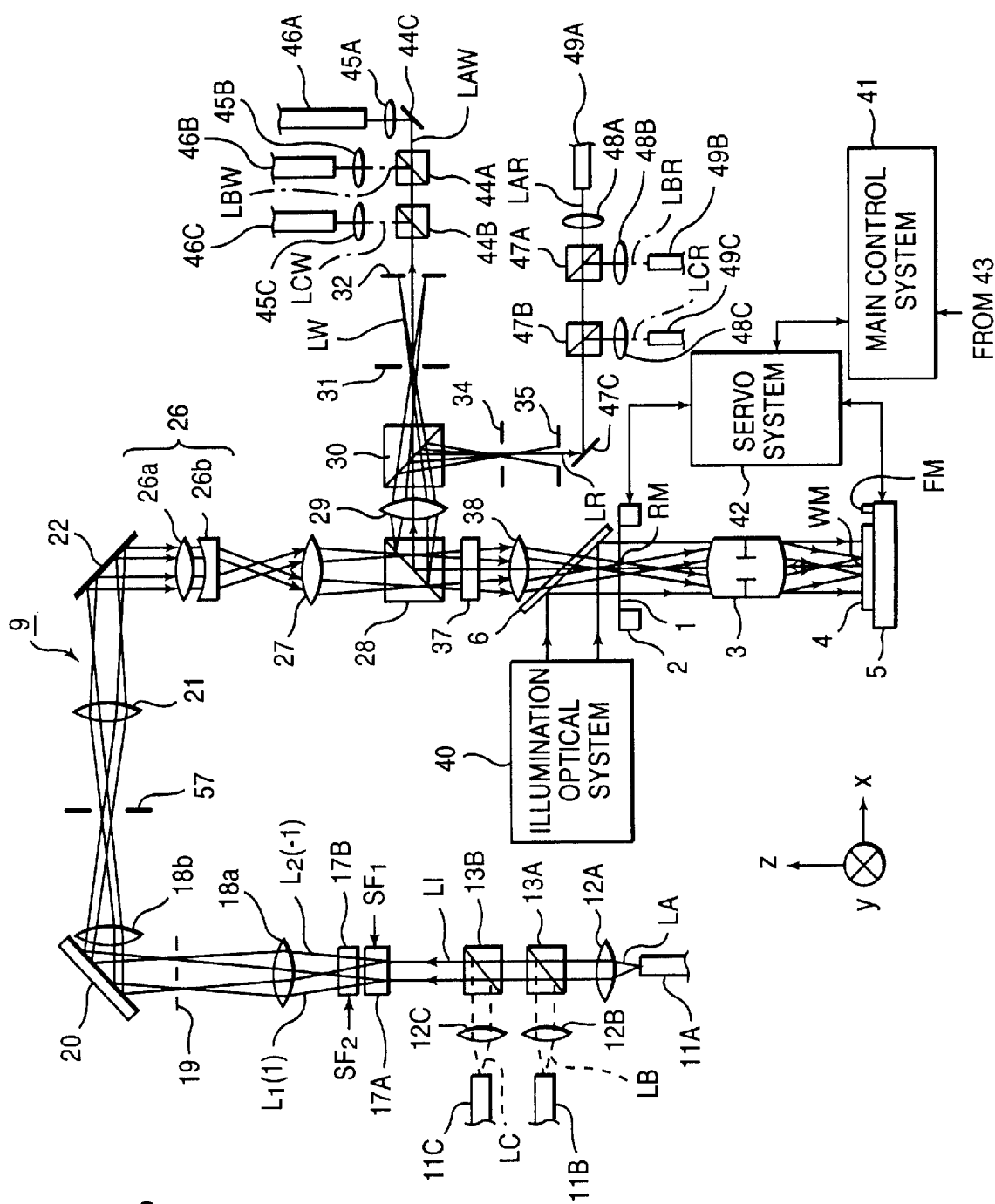
FIG. 2 is a schematic structural diagram showing an alignment optical system 9 and a main body portion 8 of FIG. 1.

FIG. 2 illustrates the construction of the alignment optical system 9 and the exposing main body portion 8 of the projection exposure apparatus in the first embodiment of the present invention. As shown in FIG. 2, a reticle 1 is provided with a circuit pattern of a predetermined shape and with a reticle mark RM of a diffraction grating form at a peripheral portion around the pattern as a mark for alignment. The reticle 1 is held on a reticle stage 2 disposed so as to be movable in two dimensions and it is located thereon so as to be conjugated with a wafer 4 with respect to a projection optical system (projection objective lens) 3. In the following description, the direction parallel to the optical axis of the projection optical system 3 is set as a z-axis, the direction on the plane perpendicular to the z-axis and parallel to the paper surface of FIG. 1 is set as an x-axis, and the direction perpendicular to the paper surface of FIG. 1 is set as a y-axis.

The light from an illumination optical system 40 for use in exposing the circuit pattern on the reticle 1 onto the wafer 4 is so arranged as to reflect downwards by a dichroic mirror 6 arranged so as to be directed upwardly at an angle of inclination of 45° with respect to the z-axis and to illuminate the reticle 1 at a uniform degree of illuminance. Upon exposure to the light from the illumination optical system 40, the pattern on the reticle 1 is transcribed on each of shot areas on the wafer 4 by the projection optical system 3. The wafer 4 is provided in each of the short areas with a wafer mark WM of a diffraction grating shape for use in alignment, in substantially the same manner as the reticle mark RM formed on the reticle 1.

The wafer 4 is held on a wafer stage 5 so as to be movable in two-dimensions, i.e. x-axial and y-axial directions, in a step-and-repeat system. As the reticle pattern has been transcribed on one of the shot areas on the wafer 4, the wafer is moved in a stepwise manner to the next shot area. In order to allow the discrete detection of the position of the wafer 4 in the direction of rotation ($\theta$) on the plane in the x-axial and y-axial directions and in the xy-axial direction in the reticle stage 2 and the wafer stage 5, each stage is provided with an interferometer, although not shown, that can discretely detect the position in the direction of rotation ($\theta$) in the x-axial and y-axial directions and in the x-axial and y-axial plane in the reticle stage 2 and the wafer stage 5. Further, each stage can be driven in each of the directions by a driving motor, although not shown.

On the other hand, the alignment optical system 9 for detecting the position of the reticle mark RM and the wafer mark WM is provided over a dichroic mirror 6.

Now, description will be made of the alignment optical system 9 with reference to FIG. 2.

In the alignment optical system 9, the light fluxes LA and LB led from the optical fibers 11A and 11B are collimated by the lenses 12A and 12B, respectively, and they strike the dichroic mirror 13A with the plane of reflection disposed at the angle of inclination of 45° relative to the z-axis. As the dichroic mirror 13A has the characteristic of selecting the wavelength that transmits the light flux having the wavelength $\lambda A$ and reflects the light flux having the wavelength $\lambda B$, the light fluxes LA and LB strike the dichroic mirror 13B with their planes of polarization sustained and their optical axes united. The light flux LC led from the optical fiber 11C is also arranged to strike the dichroic mirror 13B with its plane of reflection disposed at the angle of inclination of 45° with respect to the z-axis after it has been collimated by the lens 13C. The dichroic mirror 13C has the characteristic of selecting the wavelengths so as to allow the light fluxes having the wavelengths $\lambda A$ and $\lambda B$ to pass therethrough and the light flux having the wavelength $\lambda C$ to reflect therefrom. Hence, the light fluxes LA, LB and LC are converted to combined light (hereinafter referred to as "light flux LI") with their polarized planes retained and with their optical axes united together and then transmitted to a first audio optical element (hereinafter referred to as "AOM") 17A in a nearly perpendicular direction. A second AOM 17B is disposed apart in a predetermined distance s behind the first AOM 17A. The first AOM 17A is driven in the reverse direction by high frequency signals $SF_1$ having a frequency $f_1$, and the second AOM 17B is driven in the reverse direction by high frequency signals $SF_2$ having a frequency $f_2$. In this case, the first frequency $f_1$ is set to be larger than the second frequency $f_2$. Hence, the light flux LI consisting of the light fluxes LA, LB and LC with the respectively predetermined wavelengths $\lambda A$, $\lambda B$ and $\lambda C$ undergoes the Raman-Nath diffraction action by the AOMs 17A and 17B.

In the following description, the order of diffraction light is considered on the basis of the direction in which the wave of the high frequency $SF_1$ advances.

A combined light (hereinafter referred to as "$L_1(1)$") of plus first-order diffraction light of the light flux LI from each of the two AOMs 17A and 17B substantially undergoes modulation of frequency by $(f_1-f_2)/2$ by the two AOMs. Likewise, another combined light (hereinafter referred to as "$L_2(-1)$") of minus first-order diffraction light of the light flux LI from the two AOMs 17A and 17B substantially undergoes modulation of frequency by $(f_1-f_2)/2$ by the two AOMs.

Thereafter, the combined light fluxes $L_1(1)$ and $L_2(-1)$ allow their light paths to be turned to minus (−) z-axial direction by a mirror 22 through a lens 18a, a reflecting mirror 20 and lenses 18b and 21. Between the lenses 18a and 18b constituting a relay optical system is provided a space filter 19 for extracting the light fluxes $L_1(1)$ and the light flux $L_2(-1)$. Although diffraction light of zero order or higher orders of the light flux LI is generated from the AOMs 17A and 17B, the space filter 19 blocks the passage of the such diffraction light, allowing only the diffraction light of plus and minus first-order to transmit therethrough. Between the lenses 18a and 18b is interposed a field diaphragm 57. The light fluxes $L_1(1)$ and $L_2(-1)$ with their light paths turned in the minus (−) z-axial direction by the mirror 22 are then allowed to be transmitted to relay optical systems 26a, 26b and 27, a beam splitter 28 and a plane parallel plate 37. The plane parallel plate 37 is disposed at a position at which the pupil surfaces of the projection optical system 3 are conjugated or in its vicinity thereof so as to be variable in an angle of inclination with respect to the optical axis of the alignment optical system and has the function of sustaining telecentricity. A combination of a thick plane parallel plate for rough adjustment with a thin plane parallel plate for minute adjustment may also be employed, in place of the plane parallel plate 37.

The light fluxes $L_1(1)$ and $L_2(-1)$ passing through the plane parallel plate 37 illuminates the reticle mark RM of the diffraction grating form on the reticle 1 from two directions at a predetermined intersecting angle through the objective lens 38 and the dichroic mirror 6.

In cases where the projection optical system 3 is not corrected of chromatic aberration with respect to the light for alignment, it is preferred that the objective lens 38 is constructed from a bi-focal optical system as proposed in Japanese Patent Unexamined Publication No. 63-283,129. This construction can divide each of the two light fluxes entered into the bifocal optical system into two rays of polarized light, which intersect at right angles to each other, both of the one rays of the polarized light directing to the first focus being converged onto the reticle 1 and both of the other rays thereof directing to the second focus being converged onto the wafer 4.

Figure 3A:
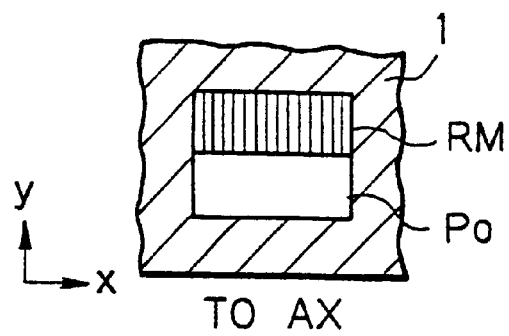
FIG. 3(a) is an enlarged plan view showing a reticle mark RM on a reticle 1 of FIG. 2.
Figure 3B:
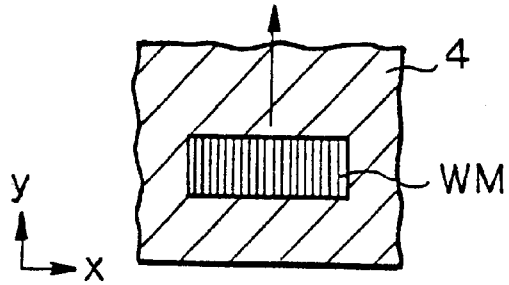
FIG. 3(b) is an enlarged plan view showing a wafer mark WM on a wafer 4.
Figure 4A:
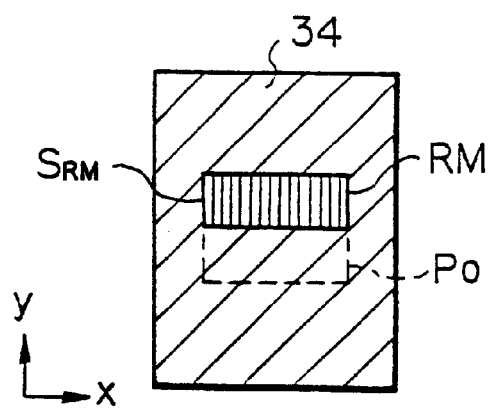
FIG. 4(a) is an enlarged plan view showing a field diaphragm 34 of FIG. 2.
Figure 4B:
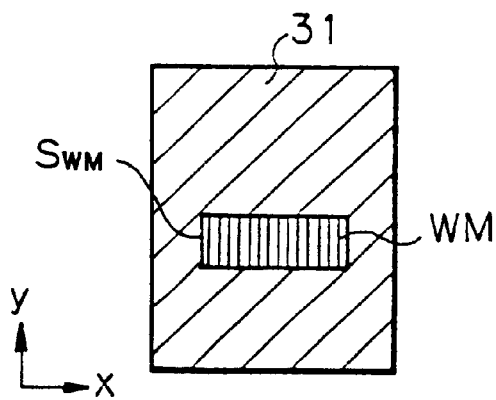
FIG. 4(b) is an enlarged plan view showing a field diaphragm 31.

As described hereinabove, the light fluxes $L_1(1)$ and $L_2(-1)$ illuminate the reticle mark RM on the reticle 1. The reticle 1 has a window $P_0$, through which to pass the light for alignment, disposed in alignment with the reticle mark RM, as shown in FIG. 3(a), and the wafer mark WM of the diffraction grating form is provided on the wafer 4 in the position corresponding to the window $P_0$, as shown in FIG. 3(b).

The light fluxes $L_1(1)$ and $L_2(-1)$ illuminate the reticle mark RM and the window $P_0$ so as to cover them from two directions, thereby generating interference fringes extending along the pitch direction on the reticle mark RM. Further the plus first-order diffraction light of the light flux $L_1(1)$ and the minus first-order diffraction light of the light flux $L_2(-1)$ are each generated in the normal direction (plus z-axial direction) of the reticle mark RM.

In the following description of this specification, a mixture of the plus first-order diffraction light of the light flux $L_1(1)$ and the minus first-order diffraction light of the light flux $L_2(-1)$ generated at the reticle mark RM is referred to as "light flux LR"; the component having wavelength AA in the light flux LR is referred to as "light flux LAR"; the component having wavelength AB in the light flux LR is referred to as "light flux LBR"; and the component having wavelength λC in the light flux LR is referred to as "light flux LCR".

The angles at which the light flux $L_1(1)$ intersects the light flux $L_2(-1)$ when illuminating the reticle mark RM from two directions are set so as to satisfy the following relationship (1):

$$\sin \theta_{RM} = \lambda_0 / P_{RM} \tag{1}$$

where $\theta_{RM}$ is the angle at which the light flux $L_1(1)$ or $L_2(-1)$ strikes the reticle mark RM;

$P_{RM}$ is the pitch of the reticle mark RM; and $\lambda_0$ is the wavelength λA, λB or λC.

In this case, the angle $\theta_{RM}$ at which the light flux $L_1(1)$ or $L_2(-1)$ enters is set so as to vary with wavelength.

This construction can generate the light flux LR from the reticle mark RM in the direction perpendicular to the +z-axial direction. Thereafter, the light flux LR generated from the reticle mark RM is allowed to pass through the dichroic mirror 6, the objective lens 38 and the parallel plane plate 37, and it is then reflected at the beam splitter 28 and transmitted to the field diaphragm 34 through the lens 29 and the beam splitter 30.

The field diaphragm 34 is disposed in the position in which it conjugates with the reticle 1. Specifically, as indicated by the oblique lines in FIG. 4(a), the field diaphragm 34 is provided with an opening portion SRM in the position corresponding to the position of the reticle mark RM in order to allow a passage of only the diffraction light from the reticle mark RM of the reticle 1.

The diffraction light from the reticle mark RM passed through the field diaphragm 34 is subjected to filtering by a space filter 35 that can block the passage of the zero-order diffraction light, thereby causing the light path of the light flux LR only to be turned by the dichroic mirror 47C. The light flux LR is then allowed to strike the dichroic mirror 47B and then the dichroic mirror 47A. The dichroic mirror 47B has the characteristic of selecting wavelengths to reflect only the light flux LCR having the wavelength λC in the light flux LR generated from the reticle mark RM of the reticle 1 and to allow the rest of the light fluxes LAR and LBR to pass therethrough. The light flux LCR reflected at the dichroic mirror 47B is collimated with the lens 48C, followed by introduction into an optical fiber 49C in which the propagation efficiency has been optimized to the wavelength λC. Then, the light flux LCR is transmitted through the optical fiber 49C and reaches the photomultiplier 51C acting as a photodetector, as shown in FIG. 1, which in turn can photoelectrically detect the optical beat signals having a frequency ($f_1 - f_2$) and containing information on the position of the reticle 1. The signals generated from the photomultiplier 51C is supplied through a low-path filter circuit (not shown) capable of passing signals having a frequency of approximately $f_1/2$ to a phase detection comparison system 43 as reticle beat signals SRC. As an example, the frequencies $f_1$ and $f_2$ may be set to be several 10 MHz and the frequency ($f_1 - f_2$) may be set to be several 10 KHz.

On the other hand, as shown in FIG. 2, the light fluxes LAR and LBR which passed through the dichroic mirror 47B enter into the dichroic mirror 47A. The dichroic mirror 47A in turn has the characteristic for selecting the wavelengths such that the light flux LBR with the wavelength λB is reflected thereby and that the light flux LAR with the wavelength λA is allowed to pass therethrough. The light flux LBR reflected by the dichroic mirror 47A is collimated by the lens 48B and it is then introduced into an optical fiber 49B with its propagation efficiency optimized to the wavelength λB, followed by transmission to a photomultiplier 51B, as shown in FIG. 1. The light flux LBR transmitted thereto is then processed in the same manner as the light flux LCR as described hereinabove to generate reticle beat signals SRB. On the other hand, the light flux LAR which also passed through the dichroic mirror 47A is collimated by the lens 48A and introduced into an optical fiber 49A with its propagation efficiency optimized to the wavelength λA, followed by transmitting to a photomultiplier 51A of FIG. 1 and generating reticle beat signals SRA in substantially the same manner as the light fluxes LBR and LCR.

Furthermore, as shown in FIG. 2, a portion of the light fluxes $L_1(1)$ and $L_2(-1)$ passed through the window $P_0$ of the reticle 1 illuminates the wafer mark WM of a diffraction grating form on the wafer 4 through the projection optical system 3 from two directions at a predetermined angle at which the light fluxes intersect with each other, thereby enabling a formation of interference fringes extending in the pitch direction on the wafer mark WM. Further, the minus first-order diffraction light of the light flux $L_1(1)$ and the plus first-order diffraction light of the light Flux $L_2(1)$ are generated in the direction of the normal of the wafer mark WM.

It is to be understood herein that a mixture of the minus first-order diffraction light of the light flux $L_1(1)$ and the plus first-order diffraction light of the light flux $L_2(-1)$ generated at the wafer mark WM is referred to as "light flux LW"; the component having wavelength λA in the light flux LW is referred to as "light flux LAW"; the component having wavelength λB in the light flux LW is referred to as "light flux LBW"; and the component having wavelength λC in the light flux LW is referred to as "light flux LCW".

The angles at which the light fluxes $L_1(1)$ and $L_2(-1)$ illuminate the wafer mark WM from two directions are set so as to satisfy the following relationship:

$$\sin \theta_{WM} = c/P_{WM} \qquad (2)$$

where $\theta_{WM}$ is the angle at which the light flux $L_1(1)$ or $L_2(-1)$ strikes the wafer mark WM;

$P_{WM}$ is the pitch of the wafer mark WM; and $\lambda_0$ is the wavelength λA, λB or λC.

In this case, the angle $\theta_{WM}$ at which the light fluxes $L_1(1)$ or $L_2(-1)$ enters is set so as to vary with wavelength.

This construction allows the light flux LW generated from the wafer mark WM to be reflected again by a beam splitter 28 after passage through the projection optical system 3, the window $P_0$, the dichroic mirror 6, the objective lens 38 and the parallel plane plate 37, followed by transmission through the lens 29 and the beam splitter 30 to a field diaphragm 31.

The field diaphragm 31 is disposed in the position in which it conjugates with the wafer 4. Specifically, as indicated by the oblique lines in FIG. 4(b), the field diaphragm 31 is provided with an opening portion SWM in the position corresponding to the position of the wafer mark WM of the wafer 4 in order to allow a passage of only the diffraction light from the wafer mark WM of the wafer 4.

The diffraction light from the wafer mark WM passed through the field diaphragm 31 is subjected to filtering by a space filter 32 that can cut the zero-order diffraction light, thereby allowing only the light flux LW to strike the dichroic mirror 44B and thereafter the dichroic mirror 44A. The dichroic mirror 44B has the characteristic of selecting wavelengths in such a manner that only the light flux LCW having the wavelength λC in the light flux LW from the wafer mark WM of the wafer 4 can be reflected and the rest of the light fluxes LAW and LBW having the respective wavelengths λA and λB are allowed to pass therethrough. The light flux LCW reflected at the dichroic mirror 44B is collimated with the lens 48C, followed by introduction into an optical fiber 45C which has its propagation efficiency optimized to the wavelength λC. Then, the light flux LCW is transmitted through the optical fiber 46C and reaches the photomultiplier 50C acting as a photodetector, as shown in FIG. 1, which can photoelectrically detect the optical beat signals having a frequency $(f_1-f_2)$ and containing information on the position of the wafer 4. The signals generated from the photomultiplier 50C are supplied through a low-path filter circuit (not shown) capable of passing signals having a frequency of approximately $f_1/2$ to a phase detection comparison system 43 as wafer beat signals SWC.

On the other hand, as shown in FIG. 2, the light fluxes LAW and LBW which in turn have passed through the dichroic mirror 44B enter into the dichroic mirror 47A that has the characteristic for selecting wavelengths such that the light flux LBW with the wavelength λB can be reflected thereby and that the light flux LAW with the wavelength λA is allowed to pass therethrough. The light flux LBW reflected by the dichroic mirror 47A is collimated by the lens 45B and is then introduced into the optical fiber 46B with its propagation efficiency optimized to the wavelength λB, followed by transmission to a photomultiplier 50B, as shown in FIG. 1. The light flux LBW transmitted thereto is then processed in the same manner as the light flux LCW as described hereinabove to generate wafer beat signals SWB. On the other hand, the light flux LAW passed through the dichroic mirror 44A is collimated by the lens 43A and introduced into the optical fiber 46A with its propagation efficiency optimized to the wavelength λA, followed by transmitting to a photomultiplier 50A of FIG. 1 and generating wafer beat signals SWA in substantially the same manner as the light fluxes LBW and LCW.

The space filter 32 of FIG. 2 is disposed in a position approximately conjugated with the pupil of the alignment optical system, more specifically, conjugated substantially with the pupil of the projection optical system 3 (the exit pupil), so as to block a passage of the zero-order diffraction light (regularly reflected light) from the wafer mark WM on the wafer 4 therethrough and to allow a passage of only the light flux LW (the diffraction light generating in the direction perpendicular to the diffraction grating mark of the wafer 4) therethrough. In other words, the light flux LW alone can passed through the space filter 32 yet the zero-order diffraction light of the diffraction light generated from the wafer mark WM cannot pass therethrough. Likewise, the space filter 35 of FIG. 2 is disposed in a position approximately conjugated with the pupil of the alignment optical system, more specifically, conjugated substantially with the pupil of the projection optical system 3 (the exit pupil), thereby capable of blocking the zero-order diffraction light (regularly reflected light) from the reticle mark RM on the reticle 1 and allowing a passage of only the light flux LR (the diffraction light generating in the direction perpendicular to the diffraction grating mark of the reticle 1). In other words, the light flux LR alone can pass through the space filter 35 yet the zero-order diffraction light of the diffraction light generated from the reticle mark RM cannot pass therethrough.

Each of the optical fibers 46A, 46B and 46C which are employed as part of an alignment light recipient system, into which the light fluxes LAW, LBW and LCW generated from the wafer mark WM are introduced, has thier propagation efficiency optimized to each of the respective wavelengths λA, λB and λC of the corresponding light fluxes. Likewise, each of the optical fibers 49A, 49B and 49C which are employed as part of an alignment light recipient system, into which the light fluxes LAR, LBR and LCR generated from the reticle mark RM are introduced, has thier propagation efficiency optimized to each of the respective wavelengths $\lambda A$, $\lambda B$ and $\lambda C$ of the corresponding light fluxes. For each optical fiber, however, the characteristic for holding a plane of polarization may be optional.

With the arrangement of the alignment optical system as described hereinabove, each of the three beat signals SRA, SRB and SRC obtained through the low-path filter circuit (not shown) from the respective photomultipliers 51A, 51B and 51C of the position detection system for detecting the position of the reticle 1 contains optical beat signals of a sinusoidal wave form, each having the same frequency $\Delta f(=f_1-f_2)$. Further, each of the three beat signals SWA, SWB and SWC obtained through the low-path filter circuit (not shown) from the respective photomultipliers 50A, 50B and 50B of the position detection system for detecting the position of the wafer 4 contains optical beat signals of a sinusoidal wave form, each having the same frequency $\Delta f(=f_1-f_2)$. Each of the six optical beat signals of the sinusoidal wave form having the frequency $\Delta f$ can be extracted with high precision from the photoelectrical signals by an optical beat signal extracting portion (Fourier transform circuit) in the phase detection comparison system 43.

When the reticle 1 and the wafer 4 are allowed to locate in optional positions in such a state that they are not aligned with each other, each of the respective optical beat signals is deviated by a constant phase. The phase difference (±180° or less) between each of the optical beat signals from the reticle 1 and the wafer 4 corresponds primarily to the amount of deviation of the relative positions by a ½ pitch or less of the grating of the diffraction grating mark formed on each of the reticle 1 and the wafer 4.

Therefore, as the reticle 1 and the wafer 4 are moved relative to each other in the direction of the orientation of the grating, the amount of deviation of the relative positions between the reticle 1 and the wafer 4 is pre-aligned with each other with the precision of a ½ pitch or less of the grating of the reticle mark RM and the wafer mark WM. The main control system 41 is constructed in such a way that the reticle stage 2 or the wafer stage 5 is moved in two-dimensional or x- and y-axial directions by a survo system 42 so as to align the reticle 1 with the wafer 4 by making the phase difference determined by the phase difference detection system 43 zero or a predetermined value. This construction can align the reticle 1 with the wafer 4 with a high degree of precision.

Now, description will be made of the way in which the phase difference detection system 43 detects and determines the phase difference. The phase difference detection system 43 is so adjusted as to detect a phase difference $\Delta\phi_1$ between the wafer beat signal SWA and the reticle beat signal SRA, a phase difference $\Delta\phi_2$ between the wafer beat signal SWB and the reticle beat signal SRB, and a phase difference $\Delta\phi_3$ between the wafer beat signal SWC and the reticle beat signal SRC. The phase differences $\Delta\phi_1$, $\Delta\phi_2$ and $\Delta\phi_3$ represent relative movement distances $\Delta x_1$, $\Delta x_2$ and $\Delta x_3$, respectively, between the wafer mark WM and the reticle mark RM relative to the pitch $P_{WM}$, according to the following relationships:

$$\Delta x1 = \Delta\phi_1 \times P_{WM}/(4\pi) \quad (3)$$

$$\Delta x2 = \Delta\phi_2 \times P_{WM}/(4\pi) \quad (4)$$

$$\Delta x3 = \Delta\phi_3 \times P_{WM}/(4\pi) \quad (5)$$

When the measurement is implemented by the wavelengths $\lambda A$, $\lambda B$ and $\lambda C$, it is ideal that the relative movement distances $\Delta x_1$, $\Delta x_2$ and $\Delta x_3$, respectively, become equal to each other. As a circuit pattern of a semiconductor or the like comprises a laminate structure of thin films, however, it is not always the case that the wafer mark WM sustains its symmetrical grating shape during manufacture or in a particular layer. For example, a reference mark FM provided on the wafer stage 5 of FIG. 5 is aligned in advance and measurement is performed in the same manner as for detection of the position of the wafer mark WM, and so-called baseline checking is implemented to provide the phase differences $\Delta\phi0_1$, $\Delta\phi0_2$ and $A\phi0_3$ between the reference mark FM and the reticle mark RM. Then, the wafer mark WM is aligned within the precision of plus minus $\pm P_{WM}/4$ or less by a search alignment sensor, although not shown, and the phase differences $\Delta\phi1$, $\Delta\phi2$ and $\Delta\phi3$ in this case are measured. By comparing the phase differences in this case with those phase differences as measured by the baseline checking method, the precise position of the wafer mark WM is determined.

In that case, the ratios of the amplitudes of the wafer beat signals SWA, SWB and SWC corresponding to the wafer mark WM (the amplitudes of the beat signals in a sine wave form) to the amplitudes of the wafer beat signals SWA, SWB and SWC at the time of measuring the reference mark FM are determined as w1, w2 and w3, respectively, and weigh-averaged the ratios, the phase difference can be calculated from their weigh-averaged values in accordance with the following formula:

$$\Delta\phi = \{w1 \times (\Delta\phi0_{1-\Delta\phi1}) + w2 \times (\Delta\phi0_2 - \Delta\phi_2) + w3 \times (\Delta\phi0_{3-\Delta\phi3})\}/(w1+w2+w3) \quad (6)$$

It is also possible to utilize as a reference signal a drive signal for driving the AOM 17 at the time of implementing the baseline checking, in place of the signal for detecting the position of the reference mark FM provided on the wafer stage 4.

In this embodiment, a detailed description will be made of the specific construction and the principle of generating two light fluxes having different frequencies with reference to FIG. 5(a).

Figure 5A:
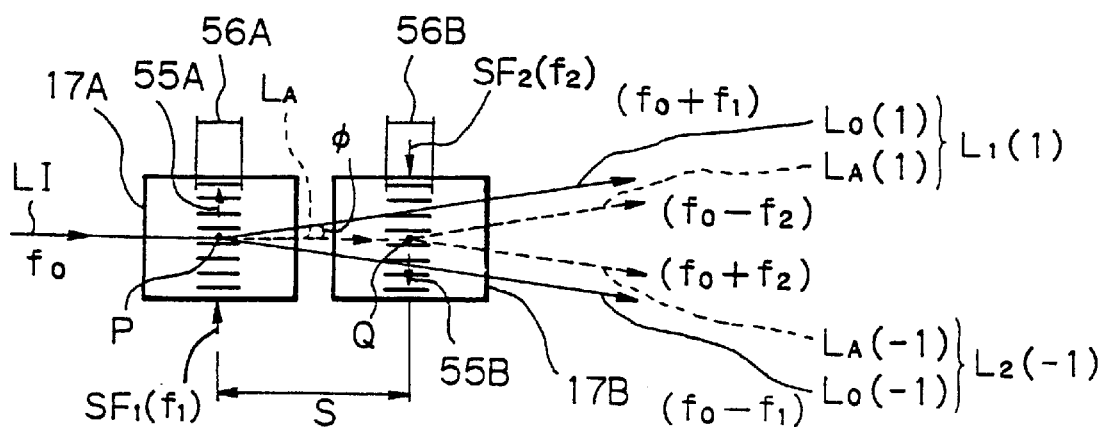
FIG. 5(a) is a schematic view illustrating the principle of creating two light fluxes (two light fluxes having frequencies different from each other) of AOM 17A AND 17B of FIG. 2.

As shown in FIG. 5(a), when a light flux LI as mixed light consisting of the light fluxes LA, LB and LC strikes a first AOM 17A in the perpendicular direction thereto, the zero-order diffraction light LA, plus first-order diffraction light $L_0(1)$, minus first-order diffraction light $L_0(-1)$, and other higher-order diffraction light are generated for each wavelength from the AOM 17A by the Raman-Nath diffraction action of the AOM 17A. The light fluxes are then entered into a second AOM 17B in the perpendicular direction thereto. In this case, when the diffraction angle of the diffraction light in the direction of the normal of the AOM 17A is set as $2\phi$, the wavelength of the wave 55A within the AOM 17A is set as $\Lambda_G$, the speed of the wave 55A is set as v, the wavelength of the light flux LI is set as $\lambda$ (frequency $f_0$), and the order of the diffraction light is set as the first order, the following relationship can be established:

$$\Lambda_G = v/f_1 \quad (7)$$

$$\sin 2\phi = \lambda/\Lambda_G \quad (8)$$

The zero-order diffraction light LA from the first AOM 17A generates the zero-order diffraction light, plus first-order diffraction light $L_A(1)$, minus first-order diffraction light $L_A(-1)$, and other higher-order diffraction light for each wavelength from an AOM 17B by the Raman-Nath diffraction action of the AOM 17B. In this embodiment, there is employed a light flux $L_1(1)$ obtained by mixing the light flux of the plus first-order diffraction light $L_0(1)$ from the AOM 17A, which has passed intact through the AOM 17B, with the plus first-order diffraction light $L_A(1)$ from the AOM 17B. Further, there is employed a light flux $L_2(-1)$ obtained by mixing the light flux of the minus first-order diffraction light $L_0(-1)$ from the AOM 17A, which has passed intact through the AOM 17B, with the plus first-order diffraction light $L_A(-1)$ from the AOM 17B. In addition, the plus first-order diffraction light $L_0(1)$ from the AOM 17A is subjected to frequency modulation to frequency $(f_0+f_1)$ and the plus first-order diffraction light $L_A(1)$ from the AOM 17B is subjected to frequency modulation to frequency $(f_0-f_2)$. Likewise, the minus first-order diffraction light $L_0(-1)$ from the AOM 17A is subjected to frequency modulation to frequency $(f_0-f_1)$ and the minus first-order diffraction light $L_A(-1)$ from the AOM 17B is subjected to frequency modulation to frequency $(f_0+f_2)$. Substantially, the modulated frequency of the light flux $L_1(1)$ is $(f_1-f_2)/2$, and the modulated frequency of the light flux $L_2(-1)$ is $(f_2-f_1)/2$.

In this embodiment, too, the distance s determined by translation into the air length between the center P of the supersonic action region 56A of the AOM 17A and the center Q of the supersonic action region 56B of the AOM 17B is set so as to satisfy the condition of the formula (9) or (10) as follows:

$$(m-1/3)\Lambda^2/\lambda < s < (m+1/3)\Lambda^2/\lambda \quad (9)$$

$$(m-1/3)v^2/(\lambda f_2) < s < (m+1)v^2/(\lambda f_2) \quad (10)$$

wherein m is an integer.

Figure 5B:
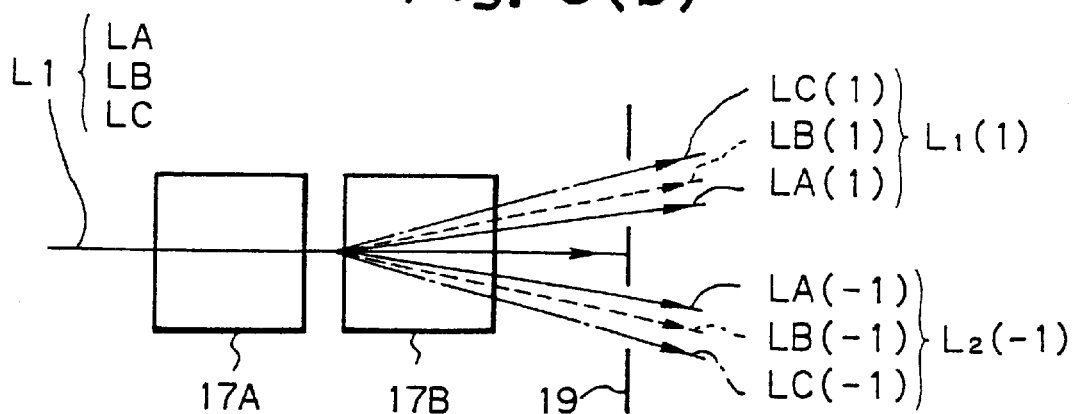
FIG. 5(b) is a schematic view showing the state in which FIG. 5(a) converts to multiple wavelengths.

FIG. 5(b) shows the instance where the construction of FIG. 5(a) is decomposed into light fluxes having three colors, because the light flux LI is a mixed light consisting of the light fluxes LA, LB and LC. The light flux $L_1(1)$ in FIG. 5(a) can be decomposed into the plus first-order diffraction lights $L_A(1)$, LB(1) and LC(1) by modulating the frequencies of the light flux LA with the wavelength $\lambda A$, the light flux LB with the wavelength $\lambda B$ and the light flux LC with the wavelength $\lambda C$, respectively, by $(f_1-f_2)/2$. Likewise, the light flux $L_2(-1)$ can be decomposed into the minus first-order diffraction lights LA(-1), LB(-1) and LC(-1) by modulating the frequencies of the light flux LA with the wavelength $\lambda A$, the light flux LB with the wavelength $\lambda B$ and the light flux LC with the wavelength $\lambda C$, respectively, by $(f_1-f_2)/2$. The other light fluxes are blocked by a space filter 19.

Figure 6:
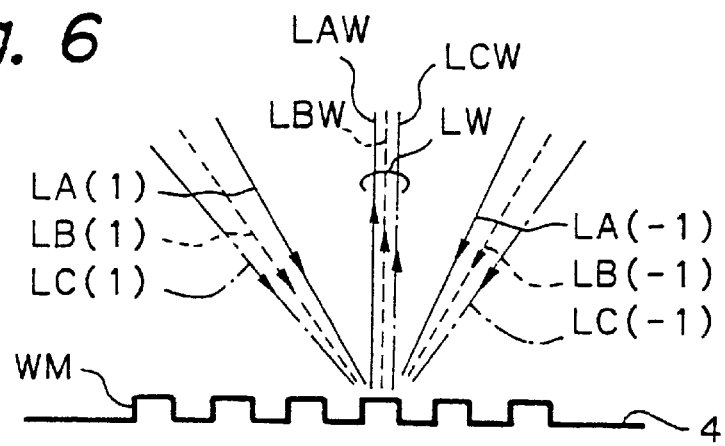
FIG. 6 is a schematic view showing the state in which diffraction light is generated at the wafer mark WM provided on the wafer 4.

FIG. 6 shows the manner in which the light fluxes $L_1(1)$ and $L_2(-1)$ modulated by the AOMs 17A and 17B, respectively, strike the wafer mark WM of a diffraction grating and the plus and minus first-order diffraction light are generated in an upwardly perpendicular direction. As shown in FIG. 6, there is generated light flux LW consisting of a mixture of the minus first-order diffraction light of each of the plus first-order diffraction light LA(1), LB(1) and LC(1) with the plus first-order diffraction light of each of the minus first-order diffraction light LA(-1), LB(-1) and LC(-1). The light flux LW consists of light flux LAW comprised of the plus minus first-order diffraction light having the wavelength $\lambda A$, the light flux LBW comprised of the plus minus first-order diffraction light having the wavelength $\lambda B$, and the light flux LCW comprised of the plus minus first-order diffraction light having the wavelength $\lambda C$. Likewise, each of the reticle mark RM and the reference mark FM generates interference light having three different wavelengths in substantially the same manner as described hereinabove.

This embodiment adopts an alignment sensor of a heterodyne interference type in the LIA system using three different kinds of colors and this enables alignment with an extremely high degree of precision. As shown in FIG. 1, however, this type of apparatus requires the disposition of six photomultipliers 50A–50C and 51A–51C, each inclusive, as photodetectors in the light recipient system of the alignment device and light sources 10A–10C, inclusive, consisting of three laser diodes as alignment light sources. The photomultipliers and the light sources also act as heat sources that cause a rise in the temperature and the temperature gradient around the ambient environment. On the other hand, exposure apparatuses for use in manufacturing semiconductors or the like are provided with a number of optical units such as the projection optical system 3 and so on. Therefore, they require extremely stringent temperature management in order to prevent the optical units from causing any aberration due to thermal expansion and at the same time to prevent the wafer 4 as a substrate from causing any adverse effect on the precision of superimposition of on circuit patterns due to thermal expansion.

In accordance with the present invention, therefore, improvements have been made with the purpose of eliminating or reducing such an influence of heat generation to a great extent by locating the photomultipliers 50A–50C and 51A–51C as potential heat sources as well as the light sources 10A–10C, each inclusive, separate from the exposing main body portion of the exposure apparatus and transmitting the alignment detection light and the alignment illumination light via the optical fibers 11A–11C, 46A–46C and 49A–49C, each inclusive.

Further, as each of the optical fibers 11A–11C, inclusive, which function as a light transmission system and the optical fibers 46A–46C and 49A–49C, each inclusive, which function as a light recipient system, are arranged so as to transmit only the light flux of the wavelength with its propagation efficiency optimized, the light flux of each wavelength can be employed with the highest possible efficiency. Furthermore, the present invention can remove the risk that noise may arise upon transmission of a light flux of multiple wavelengths through one optical fiber or that an error in alignment may arise when the wavelengths have different propagation efficiencies.

Second Embodiment

A second embodiment of the present invention will be described with reference to FIG. 7, in which the present invention is applied to an alignment sensor of a heterodyne interference type in the projection exposure apparatus of the LIA system. Although the plus minus first-order diffraction light generated by the heterodyne interference is employed as a light for detection in the first embodiment, there are also employed in the second embodiment, as a light for detection, the zero-order light and the plus minus second-order light, generated simultaneously in the reticle mark RM, the wafer mark WM nd the reference mark FM. As the optical beat signals an also be generated by interference between the zero-order light and the plus second-order light and between the zero-order light and the minus second-order light, the optical beat signals can be employed, too, for detecting the positions of the marks in substantially the same manner as in the first embodiment. As the wavelength selection means of the light recipient system, there may be employed a dichroic mirror by applying the principle in the same manner as employed in the first embodiment. Further, as it is required for each wavelength to transmit interference light consisting of the plus and minus first-order light, interference light consisting of the zero-order light and the plus second-order light, and interference light consisting of the zero-order light and the minus second-order light, three optical fibers are required for each wavelength as a light recipient system, for example, for the wafer mark WM, so that a total of 9 of optical fibers are required.

Figure 7:
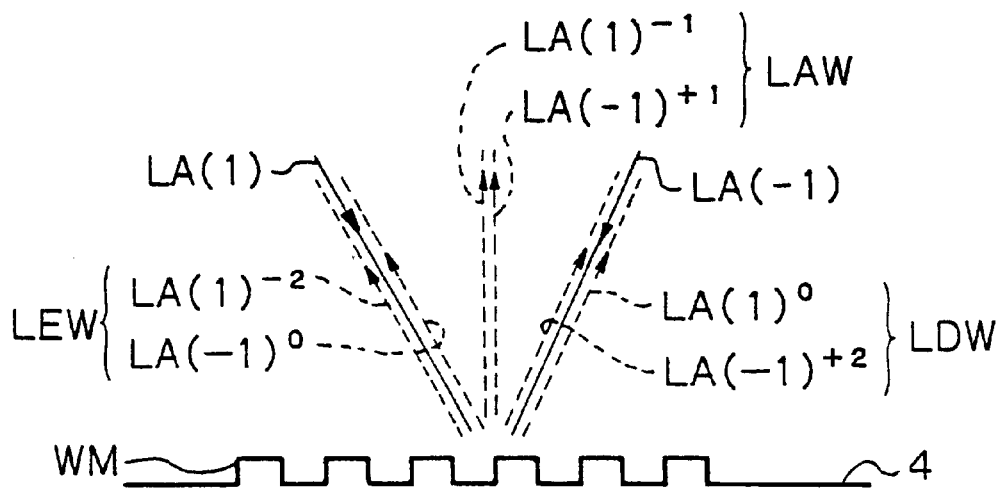
FIG. 7 is a view illustrating the principle of detection in a second embodiment of the position transducer according to the present invention.

FIG. 7 illustrates the manner of generation of diffraction light from the wafer mark WM by the light fluxes LA(1) and LA(-1) of wavelength λA. As shown in FIG. 7, light flux (interference light) LAW consisting of minus first-order diffraction light LA(1)$^{-1}$ of the light flux LA(1) and plus first-order diffraction light LA(-1)$^{+1}$ of the light flux LA(-1) is arranged so as to generate upwardly in a perpendicular direction. Further, light flux LEW obtained by the synthesis of minus second-order diffraction light LA(1)$^{-2}$ of the light flux LA(1) and gularly reflected light (zero-order light) LA(-1)$^0$ of the light flux LA(-1) is arranged so as to generate in the direction in which the light flux LA(1) enters. Likewise, light flux LDW obtained by the synthesis of zero-order light LA(1)$^0$ of the light flux LA(1) and second-order diffraction light LA(-1)$^{+2}$ of the light flux LA(-1) is arranged so as to generate in the direction in which the light flux LA(-1) enters. The light fluxes LAW, LBW and LCW, each having the wavelength λA, are then transmitted each to each of the discrete photodetectors via respective optical fibers. For each of the different wavelengths λB and λC, substantially the same processes have been carried out as the light fluxes LA(1) and LA(-1) of the wavelength λA.

Thereafter, alignment may be implemented using interference light generated by interference, for example, between the zero-order light and the plus or minus second-order diffraction light, out of the three different types of light. In this case, the wafer beat signal of the interference light generated by interference between the zero-order light and the plus second-order diffraction light of the light fluxes LA(1) and LA(-1) each having the wavelength λA on the wafer mark WM is first given and a phase difference of the wafer beat signal from the reticle beat signal SRA is given as $\Delta\phi(+2)_1$. Further, the wafer beat signal of interference light generated by interference between the zero-order light and the minus second-order diffraction light of the light fluxes LA(1) and LA(-1) each having the wavelength λA on the wafer mark WM is given and a phase difference of the wafer beat signal from the reticle beat signal SRA is given as $\Delta\phi(-2)_1$. The phase differences $\Delta\phi(+2)_1$ and $\Delta\phi(-2)_1$ are then averaged to give an average phase difference $\Delta\phi2_1$. Likewise, the phase differences $\Delta\phi(+2)_2$ and $\Delta\phi(-2)_2$ are given for the light fluxes LA(1) and LA(-1) each having the wavelength λB and they are averaged to give an average phase difference $\Delta\phi2_2$. Further, the phase differences $\Delta\phi(+2)_3$ and $\Delta\phi(-2)_3$ are given for the light fluxes LA(1) and LA(-1) having the wavelength λC and they are averaged to give an average phase difference $\Delta\phi2_3$. From these average phase differences, the relative movement distances $\Delta x_1$, $\Delta x_2$, and $\Delta x_3$ of the wafer mark WM can be given in substantially the same manner as in the first embodiment in accordance with the following formulas:

$$\Delta x_1 = \Delta\phi2_1 \times P_{WM}/(4\pi) \quad (11)$$

$$\Delta x_2 = \Delta\phi2_2 \times P_{WM}/(4\pi) \quad (12)$$

$$\Delta x_3 = \Delta\phi2_3 \times P_{WM}/(4\pi) \quad (13)$$

It is to be noted herein that whichever result of alignment performed using the phase differences $\Delta\phi_1$, $\Delta\phi_2$ and $\Delta\phi_3$ given by the plus and minus first-order diffraction light or the phase differences $\Delta\phi2_1$, $\Delta\phi2_2$ and $\Delta\phi2_3$ given by the zero-order light and the plus or minus first-order diffraction light, can be selected as a final result, by weighing by the amplitude (output) of the optical beat signals, by selecting whichever the larger amplitude is, or by using whichever the smaller an error of superimposition is by actually implementing the alignment using the above phase differences in two ways and measuring the error of superimposition of circuit patterns.

Third Embodiment

Figure 8:
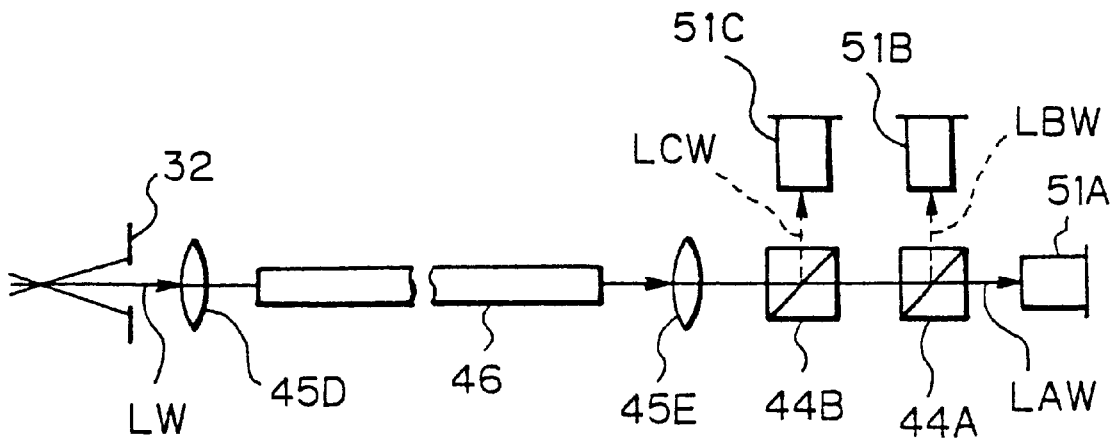
FIG. 8 is a schematic view of the essential portion of a light recipient system in a third embodiment of the position transducer according to the present invention.

A third embodiment of the present invention will be described hereinafter with reference to FIG. 8 which illustrates an embodiment in which a light flux having three different wavelengths is transmitted via one equal optical fiber and is divided into the respective three wavelengths immediately before reaching photodetector. In FIG. 8, the same elements as those illustrated in FIGS. 1 and 2 are provided with the same reference numbers and duplicate description of those elements will be omitted from the following explanation.

FIG. 8 shows the essential portion of the light recipient system of an alignment sensor to be employed in the third embodiment of the present invention. As shown in FIG. 8, this embodiment has the same construction as in the first embodiment until the light flux LW having three different wavelengths from the wafer mark WM of FIG. 2 passes through the space filter 32. Thereafter, in this embodiment, the light path extending from the space filter 32 is provided with a lens 45D that is so arranged as to converge the light flux LW and then transmit it to an optical fiber 46 capable of propagating the light flux having the three different wavelengths λA, λB and λC, followed by transmission through the optical fiber 46 immediately before a dichroic mirror 44B. The light flux LW generated from the optical fiber 46 is collimated by a lens 45E and allowed to enter into the dichroic mirror 44B that reflects a light flux LCW having wavelength λC. The light flux LCW reflected from the dichroic mirror 44B is then transmitted to a photomultiplier 51C. The dichroic mirror 44B allows the light fluxes having different wavelengths to pass therethrough, and they are allowed to enter into a dichroic mirror 44A. The dichroic mirror 44A reflects the light flux LBW with wavelength λB that in turn strikes a photomultiplier 51B and allows the light flux LAW with wavelength λA to pass therethrough. The light flux LAW passed through the dichroic mirror 44A is then allowed to enter into a dichroic mirror 51A. The position of the wafer mark WM can be detected in substantially the same manner as in the first embodiment according to the present invention.

As the light flux LW is transmitted via the optical fiber 46 immediately before selection of the wavelengths by the dichroic mirrors 44A and 44B, the third embodiment according to the present invention offers the advantage that alignment can be made in a stable manner because only one optical fiber is required which creatly reduces disturbance of the light flux LW due to turbulence of air existing around the ambient environment. It is to be noted, however, that this embodiment as shown in FIG. 8 requires an optical fiber 46 for each of the three different wavelengths λA, λB and λC, each having substantially the same propagation characteristics. Therefore, if such optical fibers are not available, the first embodiment is preferred.

In the first, second and three embodiments according to the present invention, each embodiment adopts an alignment sensor of the heterodyne interference type in the LIA system. In each of the embodiments, however, it is also possible to use an alignment sensor of a homodyne interference type or in an LSA system.

In this embodiment, too, it is possible to locate the light sources 10A–10C and the photomultipliers 50A–50C and 51A–51C, each inclusive, in a chamber different and separate from a chamber with the main body portion 8 of the exposure apparatus with the alignment optical system 9 of FIG. 1 disposed therein. This construction makes management of the exposure apparatus easier than a construction in which they are provided together in one chamber. Further, it is expected that this construction will greatly improve alignment precision. As a photodetector, there may be employed a photodiode or the like, in place of the photomultipliers 50A–50C and 51A–51C.

In accordance with the present invention, this embodiment in particular can offer the features and advantages that a detecting substrate to be detected can be separated or isolated from a photodetector acting as a heat source by locating an optical guide leading the light flux coming from the mark for position detection to the photodetector and that any reduction in precision of the position detection due to thermal expansion, etc. of the detecting substrate can be prevented, thereby allowing position detection with a high level of precision. In this case, further, as the light flux coming from the mark for position detection is led through the optical guide, this embodiment can enables the influence of turbulence of ambient air during transmission and the like to be prevented.

In accordance with the present invention, it is further noted that, as the light flux to be employed for position detection comprises a light flux having multiple wavelengths, the light flux of each wavelength can be utilized effectively when the light flux coming from the mark for position detection is led to a photodetector via a different optical guide for each of the multiple wavelengths. This arrangement provides the merit that the influence of heat generated can be reduced even if a photodetector is employed for each of the different wavelengths.

Further, the present invention offers the features and advantages that position detection for each of the wavelengths can be conducted with a high degree of precision and as a result, position detection precision can be improved to a remarkable extent due to the fact that the light flux to be employed for the position detection for each wavelength is not attenuated during transmission through a plurality of optical guides, when each of the optical guides is an optical fiber with its propagation efficiency optimized so as to allow only the light flux as an object of propagation to reflect and the rest to pass therethrough.

The present invention further provides merits that position detection can be performed in the LIA system that transmits multiple interference light of position detection of each of the order of diffraction via an optical fiber and that it detects each of the light fluxes photoelectrically. In accordance with the present invention, such merits can be achieved particularly by the construction of the mark for position detection and the photodetectors. In other words, there is employed, as a mark for position detection, a mark of a diffraction grating form having predetermined pitches arranged of measurement, and the illumination optical system is so arranged as to illuminate a multiplicity of mutually coherent light fluxes as the light flux for position detection from different directions on the mark of the diffraction grating form. More specifically, first interference light consisting of multiple diffraction light generated from the diffraction grating mark in a direction parallel to a first direction is received by a first photodetector, second interference light consisting of multiple diffraction light generated from the diffraction grating mark in a direction parallel to a second direction yet different from the first direction is received by a second photodetector, and two optical guides are disposed so as to lead the first and second interference light to the respective photodetectors that are disposed separately and independently from each other.

The additional feature and advantage achieved by the present invention resides in the fact that the light source acting as a heat source can be separated and isolated from the illumination optical system and therefore thermal expansion of the substrate, etc. to be detected can be minimized to thereby improve in alignment precision to a great extent by utilizing a light flux having multiple wavelengths as the light flux for position detection and by leading the light flux with the multiple wavelengths to the illumination optical system via an optical guide for each of the different wavelengths.

With the arrangement of the exposure apparatus according to the present invention, a high degree of precision in alignment can be achieved because the generation of heat from the position detection system is adjusted so as to anoid adversely affecting the main body portion of the exposure apparatus, photosensitizable substrate and other elements.

Fourth Embodiment

Description will now be made of a fourth embodiment of an exposure apparatus according to the present invention, with reference to FIG. 9. This embodiment is an embodiment in which the present invention is applied to a projection exposure apparatus of a stepper type having an alignment system of the LIA method wherein a light flux of multiple wavelengths is employed.

Figure 9:
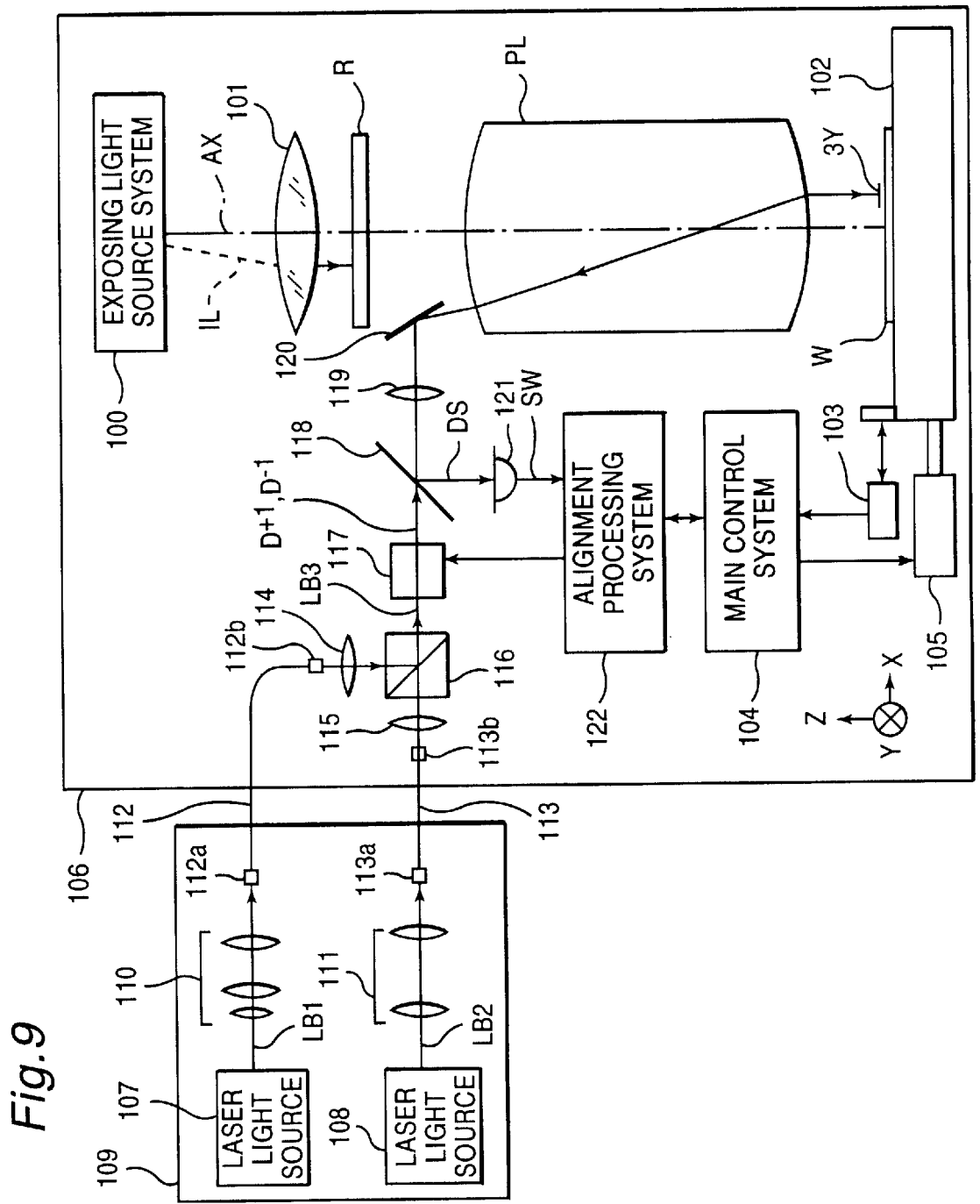
FIG. 9 is a view showing the construction of a projection exposure apparatus with an alignment system of the LIA method as a second embodiment of the exposure apparatus according to the present invention.

FIG. 9 Illustrates the projection exposure apparatus according to the fourth embodiment of the present invention. In FIG. 9, at the time of exposure, illumination light IL for exposure generated from an exposing light source system 100 consisting of a light source such as, for example, a superhigh pressure mercury lamp or excimer laser, a shape adjusting lens, an optical integrator and so on is so arranged as to illuminate a pattern area of a reticle R at a nearly uniform distribution of illuminance through an illumination optical system 101 containing a reticle blind, a main condenser lens and so on. The illumination light IL passed through the pattern area of the reticle R then strikes a projection optical system PL with both telecentric sides or one telecentric side, which in turn compresses the pattern image of the reticle R, for example, to ⅕ of the original size of the pattern thereof, and the compressed pattern image is then projected and exposed to one shot area on a wafer W the surface of which is coated with a photoresist layer and which is held in such a way that its surface is substantially aligned with the plane of the projection optical system PL on which the best possible image is formed.

Now, specific description will be made of the construction of the exposure apparatus with reference to FIG. 9, in which the direction parallel to the optical axis AX of the projection optical system PL is set as a z-axis, the direction parallel to the paper surface of FIG. 9 on the plane perpendicular to the z-axis is set as an x-axis, and the direction perpendicular to the paper surface of FIG. 9 is set as a y-axis.

The wafer W is held on a wafer stage 102 through a wafer holder, although not shown, and the wafer stage 102 is disposed in such a way that the wafer W can be aligned in the x- and y-directions by a step-and-repeat system and that it is moved in the z-direction by an autofocus system. The x- and y-directional coordinates of the wafer stage 102 is always monitored by a laser interferometer 103, and the measurement results are supplied to a main control system 104 for managing and controlling the entire action of the apparatus, thereby controlling the action of the wafer stage 102 via a stage drive system 105 on the basis of the coordinates supplied to the main control system 104.

The main body portion (the exposing main body portion) of the projection exposure apparatus having the above construction is located in a chamber 106 that is controlled so as to maintain moisture and temperature conditions constant so as to stabilize precision in dimension at the time of alignment and at the time of exposure to light.

Figure 10:
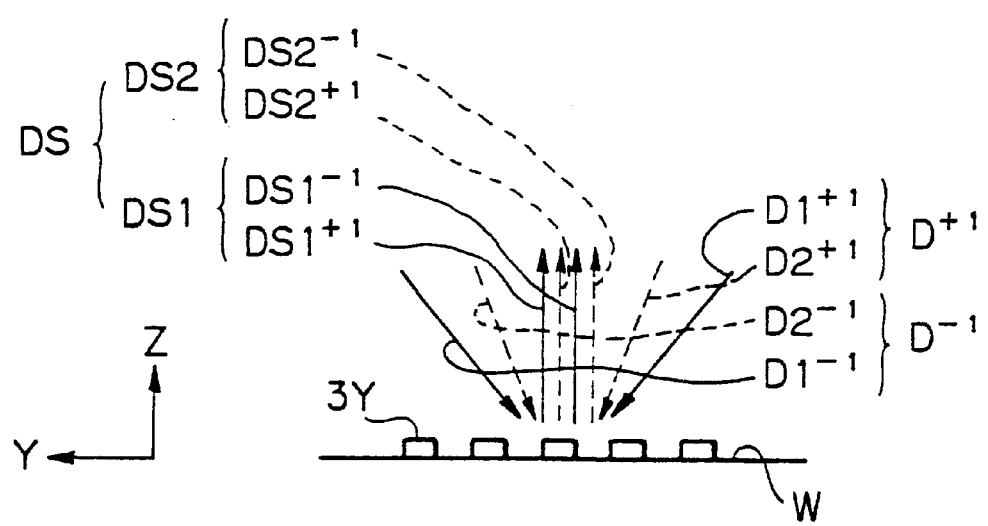
FIG. 10 is an enlarged view showing laser beams illuminated onto wafer mark 3Y of FIG. 9 and diffraction light of the laser beams from the wafer mark 3Y.

Next, description will be made of the alignment system of the exposure apparatus according to this embodiment of the present invention. The alignment system employed in this embodiment comprises an alignment system in the LIA system and in a heterodyne system, in which the light flux with multiple wavelengths is employed. In this embodiment, the detecting principle of the alignment system in both the x- and y-directions is substantially the same and consequently the detecting principle of the alignment system in the y-direction alone will be described. Each of the shot areas of the wafer W is further provided with a wafer mark of a diffraction grating form for each of the x-axis and the y-axis. In this embodiment, as shown in FIG. 10, a y-axial wafer mark 3Y is set as an object of detection, and it is a mark of a diffraction grating form with projected portions formed by predetermined pitches along the y-axial direction.

As shown in FIG. 9, two laser light sources 107 and 108, each supplying light fluxes for alignment, have different generation wavelengths $\lambda 1$ and $\lambda 2$, respectively, and they are located in a chamber 109 different from a chamber 106 with the exposing main body portion of the exposure apparatus located therein. The chambers 106 and 109 are arranged so as to have their interiors air-conditioned separately and independently from each other. In FIG. 9, the laser beams LB1 having the wavelength $\lambda 1$ coming from the laser light source 107 are transmitted through a connection optical system 110 to a top end 112a of an optical fiber 112 of a single mode. Likewise, the laser beams LB2 having the wavelength $\lambda 2$ coming from the laser light source 108 are transmitted through a connection optical system 111 to a top end 113a of an optical fiber 113 of a single mode. As each of the optical fibers 112 and 13, there may be employed one with its propagation efficiency optimized for the wavelengths $\lambda 1$ and $\lambda 2$ of the laser beams LB1 and LB2, respectively, and having a low rate of attenuation. Both of the top ends 112a and 113a of the respective optical fibers 112 and 113 are located in the chamber 109, and both of the other top ends 112b and 113b of the respective optical fibers 112 and 113 are located in the chamber 106. This disposition of the optical fibers enables the laser beams LB1 and LB2 to be transmitted from the interior of the chamber 109 through the respective optical fibers 112 and 113 to the interior of the chamber 106 without direct exposure to air within a clean room during transmission.

In the chamber 106, the laser beams LB1 transmitted via the optical fiber 112 and coming from the other top end 112b of the optical fiber 112 and the laser beams LB1 transmitted via the optical fiber 113 and coming from the other top end 113b of the optical fiber 113, respectively, are then converted to parallel light by lenses 114 and 115 and transmitted to dichroic mirrors 116 as a light flux synthesizer. The laser beams LB1 and LB2 are synthesized by the dichroic mirror 116 to one laser beam $LB_3$ that in turn strikes an audio optical element (hereinafter referred to as "AOM") 117 as a heterodyne beam creation system. It is to be noted herein that, in the current situation, as the AOM is extremely high in drive frequency, laser beams (heterodyne beams) having a predetermined difference of frequencies are created by driving, for example, two AOMs by a high-frequency signal having the predetermined difference of frequencies. As this technique is known in the art, the description that follows will be directed to the instance where the heterodyne beams are created using one AOM 117 for brevity of explanation. More specifically, the AOM 117 is driven by drive signals having a frequency fd and has the function of varying the frequency of the diffraction light of each order to be diffracted within its inside by the value of the frequency fd. The laser beams $LB_3$ coming from the dichroic mirror 116 are converted through the AOM 117 by the dichroic mirror 116 into multiple diffraction beams having each of the wavelengths $\lambda 1$ and $\lambda 2$. The following description will be made of only the plus and minus first-order diffraction light for brevity of explanation.

The plus first-order diffraction light $D^{+1}$ and the minus first-order diffraction light $D^{-1}$, each generated by diffraction of the laser beam $LB_3$ with the AOM 117, are subjected to frequency modulation by +fd and −fd, respectively, with respect to the zero-order diffraction light. The plus first-order diffraction light $D^{+1}$ and the minus first-order diffraction light $D^{-1}$ are transmitted to a beam splitter 118 and then to a lens 119 that makes their light fluxes parallel to each other, followed by transmission of the parallel light fluxes to a mirror 120 interposed between the projection optical system PL and the reticle R. The mirror 120 turns the parallel light fluxes so as to strike the projection optical system PL, and the light fluxes are then focused on the wafer mark 3Y of the grating form formed on the wafer W after the passage through the projection optical system PL.

FIG. 10 illustrates the manner in which the plus first-order diffraction light $D^{+1}$ and the minus first-order diffraction light $D^{-1}$ of the laser beams $LB_3$ strike the wafer mark 3Y. As shown in FIG. 10, the plus first-order diffraction light $D^{+1}$ consists of diffraction light $D1^{+1}$ with wavelength $\lambda 1$ and diffraction light $D2^{+1}$ with wavelength $\lambda 2$, and likewise the minus first-order diffraction light $D^{-1}$ consists of diffraction light $D1^{-1}$ with wavelength $\lambda 1$ and diffraction light $D2^{-1}$ with wavelength $\lambda 2$. The pitch of the wafer mark 3Y is selected so as to generate interference light DS consisting of the plus and minus first-order diffraction light to be generated from the wafer mark 3Y by irradiation of the plus first-order diffraction light $D^{+1}$ and the minus first-order diffraction light $D^{-1}$ of the laser beams $LB_3$. Therefore, the wafer mark 3Y generates interference light DS1 and DS2 upwardly in a perpendicular direction, the interference light DS1 consisting of plus first-order diffraction light $DS1^{+1}$ and minus first-order diffraction light $DS1^{-1}$ of each of the diffraction light $D1^{+1}$ and $D1^{-1}$, each having the wavelength $\lambda 1$, and the interference light DS2 consisting of plus first-order diffraction light $DS2^{+1}$ and minus first-order diffraction light DS2−1 of each of the diffraction light $D2^{+1}$ and D2−1, each having the wavelength $\lambda 2$. A synthesized light flux of the diffraction light DS1 and DS2 is referred to as interference light DS having two wavelengths. For each of the laser beams of the wavelengths $\lambda 1$ and $\lambda 2$, the plus first-order diffraction light $D^{+1}$ and the minus first-order diffraction light $D^{-1}$ have a frequency difference of 2fd, so that the interference light DS of the two wavelengths generated from the wafer mark 3Y by irradiation of the plus first-order diffraction light $D^{+1}$ and the minus first-order diffraction light $D^{-1}$ contains an optical beat component having the frequency 2fd. Therefore, the optical beat component functions as an optical signal for heterodyne detection.

Turning back to FIG. 9, the interference light DS reflected from the wafer mark 3Y returns from the projection optical system PL through the mirror 120 and the lens 119 back to the beam splitter 118 in the opposite direction along the optical path through which the laser beams LB3 have been transmitted to the wafer mark 3Y, followed by turning the course of the interference light DS by the beam splitter 118 to a photodetector 121 consisting of a photodiode and so on. The interference light DS having two wavelengths are photoelectrically converted into wafer beat signals SW having frequency $2fd$ and the wafer beat signals SW are then transmitted to an alignment processing system 122. The alignment processing system 122 is so arranged as to create a reference beat signal having frequency $2fd$ using the drive signals for the AOM 117 and to determine a phase difference between the reference beat signal and the wafer beat signal SW. Based on the phase difference between the reference beat signal and the wafer beat signal SW is given an amount of deviation of the position of the wafer mark 3Y in the y-axial direction, and this amount is supplied to the main control system 104. In the main control system 104, the y-coordinate of the wafer stage 102 is set as the y-coordinate of the wafer mark 3Y, when the wafer stage 102 is driven so as to make, for example, the amount of deviation of the position (the phase difference) zero. Likewise, the x-axial coordinate of the wafer mark is detected in the same manner as described hereinabove. Thereafter, the alignment of the shot area and the exposure of the pattern image of the reticle R to light are conducted on the basis of the coordinates detected.

In this embodiment, two laser light sources 107 and 108 of the alignment optical system acting as a heat source are located in the chamber 109 different from the chamber 106 in which the main body portion of the exposure apparatus is disposed. The separate disposition of the chambers 106 and 109 does not result in any adverse influence upon the main body portion of the exposure apparatus or the wafer W as the substrate to be exposed to light due to thermal expansion or for other reasons. Further, as the laser beams LB1 and LB2 are transmitted from the chamber 109 to the chamber 106 via the optical fibers 112 and 113, respectively, the laser beams LB1 and LB2 are not exposed to the open air within both of the chambers 109 and 106 so that the disturbance on the wave planes of the laser beams LB1 and LB2 can be prevented from occurring due to a vibration of the open air within the chambers 106 and 109, i.e. the air within the clean air. Therefore, alignment can always be conducted with high precision.

In this embodiment, too, the laser beams LB1 of the wavelength $\lambda 1$ generated in the chamber 109 are transmitted via the optical fiber 112 of the single mode with its transmission efficiency optimized for the wavelength corresponding to the laser beams LB1. Likewise, the laser beams LB2 of the wavelength $\lambda 2$ generated therein are transmitted via the optical fiber 113 of the single mode with its transmission efficiency optimized for the wavelength corresponding to the laser beams LB2. The laser beams LB1 and LB2 are then synthesized with the dichroic mirror 116 in the vicinity of the main body portion of the exposure apparatus within the chamber 106, thereby enabling position detection using the laser beams of each wavelength at a high SN ratio. Further, as light having multiple wavelengths is transmitted by the same optical fiber, noise which otherwise may arise due to disturbance of the optical fiber induced by vibration or for other reasons at the time of transmission can be suppressed averaging noise of each of the wavelengths, thereby enabling improvements in alignment precision.

Fifth Embodiment

Figure 11:
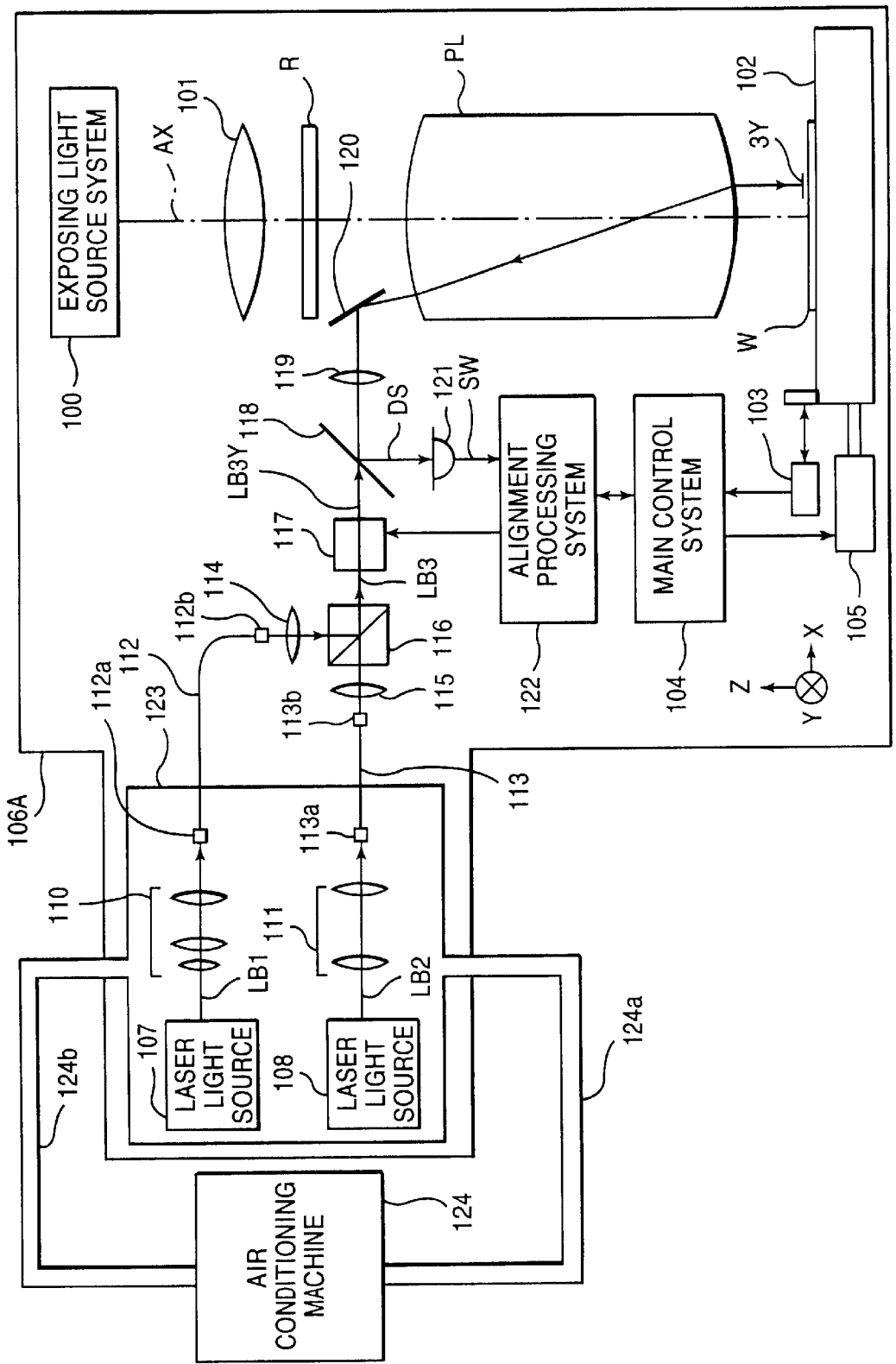
FIG. 11 is a view showing the construction of the exposure apparatus in a third embodiment of the present invention.

Description will now be made of a fifth embodiment of the exposure apparatus according to the present invention, with reference to FIG. 11. In the fifth embodiment, a smaller chamber is additionally located within a chamber in which the main body portion of the exposure apparatus is disposed, and a light source for laser beams with multiple wavelengths for alignment is disposed in the smaller chamber. As shown in FIG. 11, the elements corresponding to FIG. 9 are provided with the same reference numerals as in FIG. 9 and detailed description thereof will be omitted. In this embodiment, the construction of the main body portion of the exposure apparatus and the alignment system and the method for the position detection may be carried out in substantially the same manner as for the exposure apparatus according to the second embodiment of the present invention.

In FIG. 11, a chamber 106A is arranged to modify the chamber 106 of FIG. 9 so as to accommodate the chamber 109, and the chamber 106A is accommodated with the main body portion of the exposure apparatus in substantially the same manner as shown in FIG. 9. Further, a smaller chamber 123 is disposed in the chamber 106A and it has substantially the same structure as the chamber 109 of FIG. 9. In this construction of the chambers, the laser beams LB1 and LB2, each having two wavelengths, generated within the chamber 123, are transmitted each to the alignment optical system outside of the chamber 123 through the optical fibers 112 and 113, respectively.

As shown in FIG. 11, the exposure apparatus in the fifth embodiment of the present invention differs from the exposure apparatus of the second embodiment in that the chamber 123 is disposed within the inside of the chamber 106A and that the optical fibers 112 and 113 are disposed so as not to be exposed directly to air in the outside clean room. Further, as an air conditioning machine 124 is disposed outside the chamber 106A, and it is connected to the chamber 123 through air vent pipes 124a and 124b. The inside of the chamber 123 is allowed to cool by the air conditioning machine 124 to discharge the heat generated from the laser light sources 107 and 108 to the outside of the chambers 106A and 123 and at the same to prevent the heat from coming back into the chamber 106A through a partition wall of the chamber 123. This construction can serve as implementing alignment with a high degree of precision.

In this embodiment, as the chamber 123 is of an sufficiently adiabatic structure and the chamber 123 is allowed to cool by air conditioning, the heat transmission into the chamber 106A can be disregarded. Further, as the air conditioning machine 124 is located outside the chamber 106A and the air is discharged and introduced via a duct etc. having a high degree of heat insulation, an influence of the heat generated by the air conditioning machine 124 can also be disregarded.

Furthermore, in this embodiment, as the optical fibers 112 and 113 are disposed so as not to be exposed directly to the open air, i.e. to the air within the clean room, noises can be reduced to a smaller extent due to vibration etc. of the optical fibers resulting from disturbance of the air.

Sixth Embodiment

Figure 12:
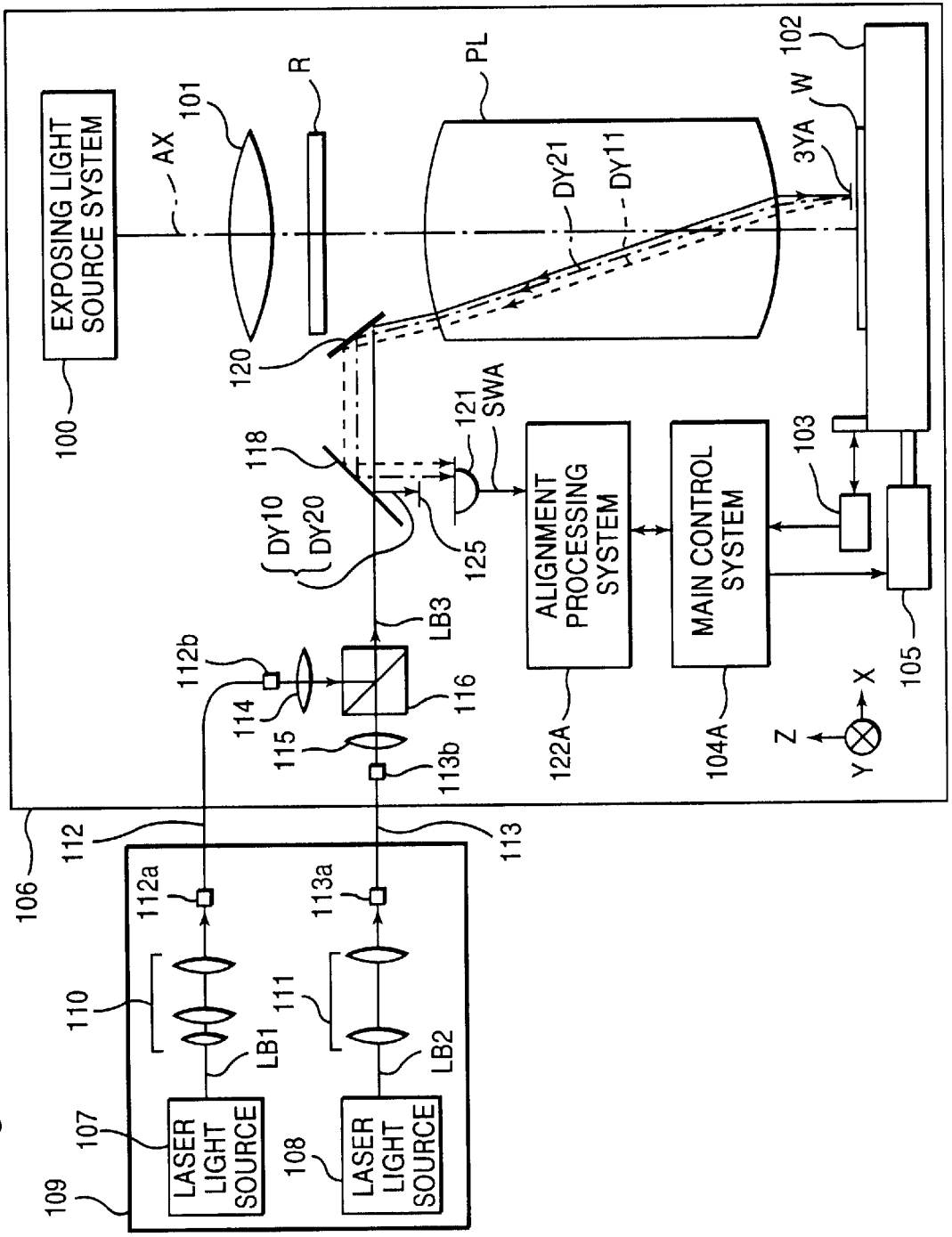
FIG. 12 is a view showing the construction of the exposure apparatus in a fourth embodiment of the present invention.

Description will now be made of the exposure apparatus according to the fourth embodiment with reference to FIGS. 12 and 13. In this embodiment, the present invention is applied to a projection exposure apparatus with an alignment system of the LSA method. In FIG. 12, the portion corresponding to FIG. 9 is provided with the same reference numerals and description of the details of the exposure apparatus is omitted.

In FIG. 12, only the alignment system in the y-axial direction is indicated because the principle of alignment in the x-axial and y-axial directions is the same.

As shown in FIG. 12, the laser beams LB1 with the wavelength $\lambda 1$ and the laser beams LB2 with the wavelength λ2 are emitted from the laser light sources 107 and 108 disposed in the chamber 109, respectively, in substantially the same manner as in the embodiment of FIG. 9. The laser beams LB1 and LB2 are then transmitted into the chamber 106 from the chamber 109 via the optical fibers 112 and 113, respectively. The laser beams LB1 and LB2 introduced into the chamber 106 from the chamber 109 via the respective optical fibers 112 and 113 are converted with the lenses 114 and 115 into parallel light fluxes that in turn strike the dichroic mirror 116 to synthesize them into one laser beam LB3. The resulting laser beam LB3 are transmitted through the beam splitter 118 to the projection optical system PL via the mirror 120 interposed between the projection optical system PL and the reticle R and is illuminated from the projection optical system PL on the wafer mark on the wafer W.

Figure 13:
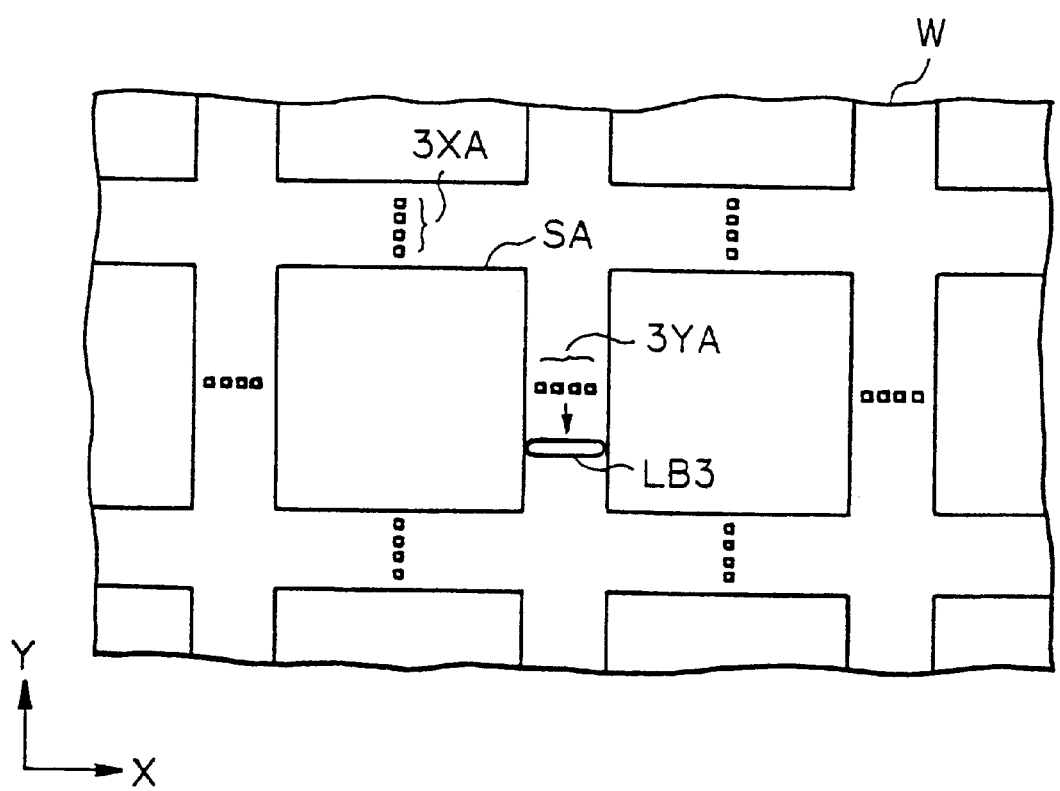
FIG. 13 is a plan view showing wafer marks 3XA and 3YA on a wafer W of FIG. 12 and laser beams LB3.

FIG. 13 illustrates a wafer mark 3XA for the LSA system, disposed in one shot area SA on the wafer W, consisting of dots arranged linearly in the x-axis, a wafer mark 3YA for the y-axis consisting of dots arranged linearly by predetermined pitches, and the laser beams LB3 converged in a slit form in the x-direction, acting as an alignment light flux for the y-axis. In FIG. 13, the wafer mark 3YA consists of a row of dots (in the form of a linear arrangement of dots) arranged by predetermined pitches, while the wafer mark 3Y employed for the exposure apparatuses in the second and third embodiments of the present invention is of the diffraction grating form arranged by predetermined pitches. When the wafer stage 102 of FIG. 12 is scanned in the y-direction and the wafer mark 3YA reaches the position crossing the area for converging the laser beams LB3, the wafer mark 3YA generates diffraction light of multiple orders.

Referring back to FIG. 12, description will be made simply of zero-order diffraction light and plus first-order diffraction light from the wafer mark 3YA alone, each of the diffraction light being from the laser beams LB1 and LB2, each having the wavelengths λ1 and λ2, acting as components of the laser beams B3, for brevity of explanation. In this example, the zero-order diffraction light and the plus first-order diffraction light of the laser beams LB1 with the wavelength λ1 are set as $DY^{10}$ and $DY^{11}$, respectively, and the zero-order diffraction light and the plus first-order diffraction light of the laser beams LB2 with the wavelength λ2 are set as $DY^{20}$ and $DY^{21}$, respectively. The diffraction light of each order is led to a beam splitter 118 through the projection optical system PL and a mirror 120, and it is directed by the beam splitter 118 to a photodetector 121 along an optical path that deviates from the optical path of the laser beams $LB_3$. A space filter 125 is disposed on the optical path of the zero-order diffraction light $DY^{10}$ and $DY^{20}$ between the beam splitter 125 and the photodetector 121 so as to block a passage of the zero-order diffraction light $DY^{10}$ and $DY^{20}$ that generate by reflection on the plane of the wafer W regardless of coincidence of the wafer mark 3YA with the laser beams $LB_3$.

The photodetector 121 is so disposed as to detect only the plus first-order diffraction light $DY^{11}$ and $DY^{21}$ that are the light fluxes generating at the time when the wafer mark 3YA coincides with the laser beams $LB_3$, and the position of the wafer mark 3YA is detected on the basis of an intensity of the plus first-order diffraction light $DY^{11}$ and $DY^{21}$ detected by the photodetector 121.

More specifically, a detecting signal SWA which is a signal converted photoelectrically from the photodetector 121 is supplied to an alignment processing system 122A. A main control system 104A for managing and controlling the action of the entire apparatus in this embodiment supplies a measured value of a laser interferometer 103 to the alignment processing system 122A upon movement of the wafer stage 102 in the y-direction via a stage drive system 105 on the basis of the coordinates of the wafer stage 102 by the laser interferometer 103. Then, the alignment processing system 122A holds, for example, the y-coordinate of the wafer stage 102 at the time when the value of the detecting signal SWA takes a peak, as a y-coordinate of the wafer mark 3YA, and it supplies the held coordinate to the main control system 104A. The x-coordinate of the x-axial wafer mark of the LSA system is detected in substantially the same manner as described hereinabove.

In this embodiment, as the laser light sources 107 and 108 acting as the heat sources are disposed in the chamber 109 located discretely from the chamber 106 with the main body portion of the exposure apparatus disposed therein, no influence of the heat generated by the heat sources is exerted upon the main body portion thereof, thereby enabling the implementation of the position detection with high precision. Further, in this embodiment, as the laser beams LB1 and LB2, each of multiple wavelengths, are employed as alignment light although the LSA system is adopted, a detecting signal having a different wavelength can be effectively employed even if a detecting signal having another wavelength would become too small due to an influence that may be exerted by interference on a thin layer by a photoresist coating or by a shape of the wafer mark or for other reasons. This can also serve to conduct alignment constantly with high precision. In addition, as the laser beams LB1 and LB2 are transmitted via the respective optical fibers 112 and 113 for different wavelengths, this embodiment provides the advantage that the laser beams of each wavelength can be utilized with maximal efficiency.

It is to be noted herein that, in the three embodiments as described hereinabove, each uses the alignment system of a TTL method. It is to be understood, however, that the present invention can be apparently applied to an alignment system of a TTR (through-the-reticle) method or of an off-axis method.

Further, in the embodiments as described hereinabove, it is also possible to use light having three wavelengths or more as an alignment light, in addition to light having two wavelengths employed in the embodiments as described hereinabove.

It should be understood, however, that the present invention is not limited in any respect to the embodiments as described hereinabove and that the present invention can encompass any variations and modifications without departing from the spirit and scope of the present invention.

As described hereinabove, the exposure apparatus of the present invention is provided with the position detection system for aligning the mask pattern with the photosensitizable substrate, which comprises a laser light source for generating laser light with multiple wavelengths, an illumination optical system for illuminating the laser light from the laser source onto a mark for position alignment on the photosensitizable substrate, and a light recipient optical system for receiving the laser light from the mark for position alignment and in which the laser light sources are located apart from the main body portion of the exposure apparatus in an isolated way. Therefore, the present invention offers the features and advantages that any adverse influence upon the main body portion of the exposure apparatus and the photosensitizable substrate by the heat generated by the laser light sources having multiple wavelengths as sources for generating heat can be excluded and the position detection can be implemented with high precision using a light flux with multiple wavelengths.

In accordance with the present invention, as the laser light of multiple wavelengths is led from the laser light source to the illumination optical system via different optical guides for different wavelengths, the efficiency of transmission of the laser light of each wavelength can be enhanced. Further, as noise can be removed readily by averaging all of the wavelengths even if such noise would be caused to occur by disturbance of the optical guides due to vibration or for other reasons, thereby enabling position detection to be effected with high precision.

In accordance with the present invention, as the light recipient optical system is so arranged as to receive the diffraction light generated by the laser light from the mark for position alignment in the predetermined direction, the position detection can effectively be implemented, for example, by the LIA system.

Furthermore, in accordance with the present invention, the illumination optical system is so arranged as to illuminate the laser light of multiple wavelengths onto a mark for position detection with dots arranged in a linear sequence and to detect the position of the dots-line-shaped mark on the basis of a light amount of the diffraction light received by the light recipient optical system, so that the position detection can be implemented by the LSA system using multiple wavelengths. Therefore, an influence upon a thin layer on the photosensitizable substrate can be reduced even by the LSA system.

What is claimed is:

1. An exposure apparatus comprising:
   a substrate stage which holds a substrate including an alignment mark formed thereon;
   a main body portion which transfers a predetermined pattern onto said substrate;
   a position detection system; and
   an alignment device which is electrically connected to the position detection system,
   said position detection system including:
       a first light source which generates a first detection beam having a first wavelength;
       a second light source which generates a second detection beam having a second wavelength different from said first wavelength;
       an illumination system arranged between said light source and said substrate stage, which irradiates the first detection beam or the second detection beam onto the alignment mark formed on the substrate;
       a light recipient portion which receives a beam generated from the alignment mark and detects positional information of the mark;
       a plurality of first optical fibers arranged between said substrate stage and said light recipient portion, which form a part of a path for leading a plurality of interference lights formed by a plurality of pairs of diffraction lights generated from said alignment mark illuminated by said first detection beam onto the light recipient portion, said plurality of first optical fibers being provided correspondingly to each of said plurality of interference lights and having a propagation efficiency thereof optimized to said first wavelength; and
       a plurality of second optical fibers which are independent of said first optical fibers, which are arranged between said substrate stage and said light recipient portion, which form a part of a path for leading a plurality of interference lights formed by a plurality of pairs of diffraction lights generated from said alignment mark illuminated by said second detection beam onto said light recipient portion, said plurality of second optical fibers being provided correspondingly to each of said plurality of interference lights and having a propagation efficiency thereof optimized to said second wavelength,
   said alignment device being adapted to perform an alignment operation of said substrate, based on the positional information detected by said light recipient system.

2. The exposure apparatus as claimed in claim 1, wherein the light recipient portion comprises a plurality of light recipient portions, each of the plurality of light recipient portions being provided for each of the wavelengths of the detecting beam.

3. The exposure apparatus as claimed in claim 2, wherein said light recipient portion includes a plurality of photoelectric detectors which are provided individually correspondingly to each of said plurality of interference lights.

4. The exposure apparatus as claimed in claim 2, further comprising a wavelength separator which is provided between the substrate stage and the optical fibers and which separates said plurality of interference lights into each of the wavelengths.

5. The exposure apparatus as claimed in claim 4, further comprising:
   a calculator which is electrically connected to the plurality of light recipient portions and which calculates information regarding a position of the substrate based on the beam received by each light recipient portion provided for each of the wavelengths; and
   a determining portion which is electrically connected to the calculator and which determines information used for alignment of the substrate based on all the information calculated by the calculator for each of the wavelengths.

6. The exposure apparatus as claimed in claim 2, further comprising a wavelength separator which is provided between the optical fibers and the light recipient portion and which separates said plurality of interference lights into each of the wavelengths.

7. The exposure apparatus as claimed in claim 1, wherein the mark is a mark of a diffraction granting form arranged by a predetermined pitch in a direction of measurement and wherein the illumination system irradiates mutually coherent multiple light fluxes onto the mark of the diffraction granting form from different directions.

8. A micro-device manufactured by transferring a device pattern onto the substrate using the exposure apparatus according to claim 1.

9. An exposure method for transferring a predetermined pattern onto a substrate, the substrate including a mark formed thereon, the exposure method comprising:
   generating a first detection beam having a first wavelength from a first light source;
   generating a second detection beam having a second wavelength different from said first wavelength from a second light source;
   irradiating the first or second detection beam onto the mark formed on the substrate;
   receiving a plurality of interference lights formed by a plurality of pairs of diffraction lights generated from the mark through a plurality of first optical fibers, said plurality of first optical fibers being provided correspondingly to each of said plurality of interference lights and having a propagation efficiency thereof optimized to said first wavelength, the plurality of interference lights being generated by irradiation of the first detection beam;

receiving a plurality of interference lights formed by a plurality of pairs of diffraction lights generated from the mark through a plurality of second optical fibers different from the plurality of first optical fibers, the plurality of interference lights being generated by irradiation of the second detection beam, the plurality of second optical fibers being provided correspondingly to each of said plurality of interference lights and having a propagation efficiency thereof optimized to said second wavelength;

detecting positional information of the substrate, based on the received interference lights;

aligning the substrate based on the positional information; and transferring the predetermined pattern onto the aligned substrate.

10. The exposure method as claimed in claim 9, further comprising separating the plurality of interference lights into each of the wavelengths before the interference lights are led through the optical fibers.

11. The exposure method as claimed in claim 10, further comprising:
calculating information regarding a position of the substrate based on the beam received for each of the multiple wavelengths; and
determining information used for alignment of the substrate based on all the information calculated for each of the wavelengths.

12. The exposure method as claimed in claim 9, further comprising separating the plurality of interference lights into each of the wavelengths after the interference lights are led through the optical fibers.

13. A method for manufacturing a micro-device by transferring a device pattern onto the substrate using the exposure method according to claim 9.

14. The exposure method as claimed in claim 9, wherein said interference lights receiving steps include a step for individually receiving each of said plurality of interference lights.

15. A method for manufacturing an exposure apparatus, comprising:
providing a substrate stage which holds a substrate including an alignment mark formed thereon;
providing a main body portion which transfers a predetermined pattern onto said substrate;
providing a position detection system; and
providing an alignment device which is electrically connected to the position detection system,
said position detection system including:
a first light source which generates a first detecting beam having a first wavelength;
a second light source which generates a second detection beam having a second wavelength different from said first wavelength;
an illumination system arranged between said light sources and said substrate stage, which irradiates the first detection beam or the second detection beam onto the alignment mark formed on the substrate;
a light recipient portion which receives a beam generated from the alignment mark and detects positional information of the mark;
a plurality of first optical fibers arranged between said substrate stage and said light recipient portion, which form a part of a path for leading a plurality of interference lights formed by a plurality of pairs of diffraction lights generated from said alignment mark illuminated by said first detecting beam onto the light recipient portion, said plurality of first optical fibers being provided correspondingly to each of said plurality of interference lights and having a propagation efficiency thereof optimized to said first wavelength;
a plurality of second optical fibers which are independent of said first optical fibers, which are arranged between said substrate stage and said light recipient portion, which form a part of a path for leading a plurality of interference lights formed by a plurality of pairs of diffraction lights generated from said alignment mark illuminated by said second detection beam onto said light recipient portion, said plurality of second optical fibers being provided correspondingly to each of said plurality of interference lights and having a propagation efficiency thereof optimized to said second wavelength; and
said alignment device being adapted to perform alignment of said substrate, based on the positional information detected by said light recipient portion.

16. An exposure apparatus comprising:
a substrate stage which holds a substrate including an alignment mark formed thereon;
a main body portion which transfers a predetermined pattern onto said substrate;
a position detection system; and
an alignment portion which is electrically connected to the position detection system,
said position detection system including:
a first light source which generates a first detection beam having a first wavelength, said alignment mark formed on said substrate being illuminated by said first detection beam;
a second light source which generates a second detection beam having a second wavelength different from said first wavelength, said alignment mark formed on said substrate being illuminated by said second detection beam;
an illumination system which irradiates the first detection beam or the second detection beam onto the alignment mark formed on the substrate;
a light recipient portion which receives a beam generated from the alignment mark;
a plurality of first optical fibers arranged between said substrate stage and said light recipient portion, which form a part of a path for leading a plurality of interference lights formed by a plurality of pairs of diffraction lights generated from said alignment mark illuminated by said first detection beam onto the light recipient portion, said plurality of first optical fibers being provided correspondingly to each of said plurality of interference lights; and
a plurality of second optical fibers which are independent of said first optical fibers, which are arranged between said substrate stage and said light recipient portion, which form a part of a path for leading a plurality of interference lights formed by a plurality of pairs of diffraction lights generated from said alignment mark illuminated by said second detection beam onto said light recipient portion, said plurality of second optical fibers being provided correspondingly to each of said plurality of interference lights, said alignment device being adapted to perform an alignment operation of said substrate, based on the positional information detected by said light recipient system.

17. An exposure apparatus as claimed in claim 16, wherein said light recipient portion includes a plurality of photoelectric detectors provided for each of the wavelengths of said detecting beam.

18. An exposure apparatus as claimed in claim 16, wherein said light recipient portion includes a plurality of photoelectric detectors which are provided individually correspondingly to each of said interference lights.

19. An exposure apparatus as claimed in claim 18, wherein said plurality of photoelectric detectors which are provided for each of the wavelengths of said detecting beam.

20. An exposure apparatus as claimed in claim 19, further comprising a separator which is arranged between said substrate stage and said plurality of optical fibers and which separates said plurality of interference lights generated from said mark into each of the wavelengths.

21. A device manufacturing method comprising a step of transferring a device pattern formed on a mask onto a substrate by using the exposure apparatus as claimed in claim 19.

22. An exposure apparatus comprising:
   a substrate stage which holds a substrate including an alignment mark formed thereon;
   a main body portion which transfers a predetermined pattern onto said substrate;
   a position detection system; and
   an alignment device which is electrically connected to the position detection system,
   said position detection system including:
      a light source which generates a detection beam, said alignment mark formed on said substrate being illuminated by said detection beam;
      an illumination system which irradiates the detection beam onto the alignment mark formed on the substrate;
      a light recipient portion which receives a beam generated from the alignment mark; and
      a plurality of optical fibers arranged between said substrate stage and said light recipient portion, which form a part of a path for leading a plurality of interference lights formed by a plurality of pairs of diffraction lights generated from said alignment mark illuminated by said detection beam onto the light recipient portion, said plurality of optical fibers being provided correspondingly to each of said plurality of interference lights,
      said alignment device being adapted to perform an alignment operation of said substrate, based on the positional information detected by said light recipient system.

23. An exposure apparatus as claimed in claim 22, wherein said light recipient portion includes a plurality of photoelectric detectors which are provided individually correspondingly to each of said interference lights.

24. A device manufacturing method comprising a step of transferring a device pattern formed on a mask onto a substrate by using the exposure apparatus as claimed in claim 23.

* * * * *